United States Patent
Tsai et al.

(10) Patent No.: US 9,099,191 B2
(45) Date of Patent: Aug. 4, 2015

(54) CURRENT SENSING AMPLIFIER AND SENSING METHOD THEREOF

(71) Applicant: eMemory Technology Inc., Hsin-Chu (TW)

(72) Inventors: Yu-Hsiung Tsai, Hsinchu (TW); Yuan-Tai Lin, Hsinchu (TW); Chi-Yi Shao, Taichung (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 149 days.

(21) Appl. No.: 13/909,187

(22) Filed: Jun. 4, 2013

(65) Prior Publication Data

US 2014/0355353 A1 Dec. 4, 2014

(51) Int. Cl.
*G11C 16/28* (2006.01)

(52) U.S. Cl.
CPC .................................... *G11C 16/28* (2013.01)

(58) Field of Classification Search
CPC ..... G11C 16/28; G11C 16/26; G11C 11/5642
USPC ............... 365/205, 206, 207, 189.07, 189.05, 365/189.06, 189.09, 185.21
See application file for complete search history.

(56) References Cited

U.S. PATENT DOCUMENTS

| 6,400,632 | B1 | 6/2002 | Tanizaki et al. | |
|---|---|---|---|---|
| 7,495,984 | B2 * | 2/2009 | Kim et al. | 365/210.1 |
| 7,515,493 | B2 * | 4/2009 | Di Vincenzo et al. | 365/207 |
| 8,654,595 | B2 * | 2/2014 | Kim et al. | 365/189.15 |
| 2013/0064008 | A1 * | 3/2013 | Kim et al. | 365/158 |

* cited by examiner

*Primary Examiner* — Son Dinh
*Assistant Examiner* — Jerome Leboeuf
(74) *Attorney, Agent, or Firm* — WPAT, PC; Justin King

(57) ABSTRACT

A sensing method of a current sensing amplifier is provided used for determining a storing state of a cell of a non-volatile memory device during a read cycle. After a sensing node and a reference node are adjusted to a constant voltage, the sensing node and the reference node are maintained in a floating state. Then, the sensing node is connected with a data line to receive a cell current from the cell, and the reference node is connected with a reference current source to receive a reference current from the reference current source. When a reference voltage of the reference node reaches a preset voltage, the storing state of the cell is determined according to a relationship between a sensing voltage of the sensing node and the preset voltage.

23 Claims, 11 Drawing Sheets

CURRENT SENSING AMPLIFIER AND SENSING METHOD THEREOF

FIELD OF THE INVENTION

The present invention relates to a current sensing amplifier and a sensing method thereof, and more particularly to a current sensing amplifier of a non-volatile memory device and a sensing method thereof.

BACKGROUND OF THE INVENTION

As is well known, a non-volatile memory device such as a SD card is widely used in a variety of electronic devices. Generally, the non-volatile memory device comprises a memory array, and the memory array comprises plural cells. Each cell comprises a floating gate transistor. The floating gate transistor of each cell has a floating gate to store hot carriers. The storing state of the floating gate transistor may be determined according to the amount of the stored hot carriers.

Generally, after the hot carriers are injected into the floating gate transistor, a threshold voltage ($V_{TH}$) of the floating gate transistor is changed according to the amount of the injected hot carriers. If a floating gate transistor has a higher threshold voltage, it means that a higher gate voltage is required to turn on the floating gate transistor. Whereas, if a floating gate transistor has a lower threshold voltage, it means that the floating gate transistor can be turned on by a lower gate voltage.

During a program cycle of the non-volatile memory device, the threshold voltage of the floating gate transistor may be changed by controlling the amount of hot carriers to be injected into the floating gate. During a read cycle of the non-volatile memory device, a read voltage is provided to the floating gate transistor, and thus a cell current (also referred as a read current) is generated. According to the magnitude of the cell current, the storing state (e.g. an on state or an off state) of the floating gate transistor may be realized.

For example, if the read voltage is provided to the floating gate transistor with the lower threshold voltage, the floating gate transistor is in the on state to generate a higher cell current. Whereas, if the read voltage is provided to the floating gate transistor with the higher threshold voltage, the floating gate transistor is in the off state to generate a nearly-zero cell current. That is, during the read cycle, the on-state cell may generate a higher cell current, but the off-state cell may generate a lower cell current.

Moreover, the non-volatile memory device further comprises a current sensing amplifier for receiving the cell current from the cell, thereby determining the storing state of the cell.

FIG. 1 is a schematic circuit diagram illustrating a conventional current sensing amplifier. As shown in FIG. 1, the current sensing amplifier comprises three transistors M1, M2, M3, an operational amplifier OP, and a comparator CMP. The transistor M1 and the operational amplifier OP are collaboratively defined as a clamp circuit. The drain terminal of the transistor M1 is connected with a data line DL in order to receive a cell current Icell from the cell. The gate terminal of the transistor M1 is connected with the output terminal of the operational amplifier OP. The source terminal of the transistor M1 is connected with a low voltage source Vss. Moreover, a first input terminal of the operational amplifier OP receives an input voltage Vdl, and a second input terminal of the operational amplifier OP is connected with the drain terminal of the transistor M1. Consequently, in a normal working condition, the magnitude of the drain voltage V1 of the transistor M1 of the clamp circuit is equal to the magnitude of the input voltage Vdl.

Moreover, a bias voltage Vbias is received by the gate terminal of the transistor M3, and thus the transistor M3 is served as a current source to generate a reference current Iref. The reference current Iref is received by the drain terminal of the transistor M2. The gate terminal of the transistor M2 is connected with the gate terminal of the transistor M1. The source terminal of the transistor M2 is connected with the low voltage source Vss. A first input terminal of the comparator CMP is connected with the drain terminal of the transistor M2 for receiving the drain voltage V2 of the transistor M2. A second input terminal of the comparator CMP receives the input voltage Vdl. An output data is outputted from the output terminal of the comparator CMP.

During the read cycle, the data line DL is connected with the cell to receive the cell current. When the cell is in the on state, the magnitude of the cell current Icell is higher than the magnitude of the reference current Iref, and the drain voltage V2 of the transistor M2 is lower than the input voltage Vdl. Consequently, the comparator CMP issues a first logic level (e.g. a low level). On the other hand, when the cell is in the off state, the magnitude of the cell current Icell is lower than the magnitude of the reference current Iref, and the drain voltage V2 of the transistor M2 is higher than the input voltage Vdl. Consequently, the comparator CMP issues a second logic level (e.g. a high level).

From the above discussions, the conventional current sensing amplifier can determine the storing state of the cell according to the cell current Icell generated by the cell. However, since the conventional current sensing amplifier needs the operational amplifier OP, some drawbacks occur. For example, since a DC bias current should be provided to the operational amplifier OP during normally operating of the operational amplifier OP, the power consumption of the conventional current sensing amplifier is high.

SUMMARY OF THE INVENTION

An embodiment of the present invention provides a sensing method of a current sensing amplifier for determining a storing state of a cell of a non-volatile memory device during a read cycle. The sensing method includes the following steps. First of all, after a sensing node and a reference node are adjusted to a constant voltage, the sensing node and the reference node are maintained in a floating state. Then, the sensing node is connected with a data line to receive a cell current from the cell, and the reference node is connected with a reference current source to receive a reference current from the reference current source. When a reference voltage of the reference node reaches a preset voltage, the storing state of the cell is determined according to a relationship between a sensing voltage of the sensing node and the preset voltage. If the sensing voltage of the sensing node is lower than the preset voltage, the cell is in a first storing state. Whereas, if the sensing voltage of the sensing node is higher than the preset voltage, the cell is in a second storing state.

Another embodiment of the present invention provides a current sensing amplifier for determining a storing state of a first cell of a non-volatile memory device during a read cycle. The current sensing amplifier includes a reference unit and a first sensing unit. Basically, the circuit structures of the reference unit and the first sensing unit are identical. The reference unit includes a constant voltage providing circuit and a comparing circuit. The constant voltage providing circuit and the comparing circuit are connected with a reference node.

After the reference node is adjusted to a constant voltage by the constant voltage providing circuit according to an activating signal, the reference node is connected with a reference current source to receive a reference current from the reference current source. The first sensing unit includes a constant voltage providing circuit and a latching circuit. The constant voltage providing circuit and the latching circuit are connected with a first sensing node. After the first sensing node is adjusted to the constant voltage by the constant voltage providing circuit according to the activating signal, the first sensing node is connected with a first data line to receive a first cell current from the first cell. When the comparing circuit detects that a reference voltage of the reference node reaches a preset voltage, the comparing circuit issues a latching signal to the latching circuit, so that the latching circuit determines whether the first cell is in a first storing state or a second storing state according to a relationship between a first sensing voltage of the first sensing node and the preset voltage.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

According to the properties of the non-volatile memory device, during the read cycle, different magnitudes of the cell current (also referred as a read current) are generated according to the storing state of the cell. If the cell of the non-volatile memory device has an n-type floating gate transistor (storage transistor), the cell may generate a cell current I1 in the on state but generate a cell current I2 in the off state. In accordance with the present invention, a reference current source may provide a reference current Iref. The magnitude of the reference current Iref is in the range between I1 and I2. That is, $I1 > Iref > I2$.

Figure 1:
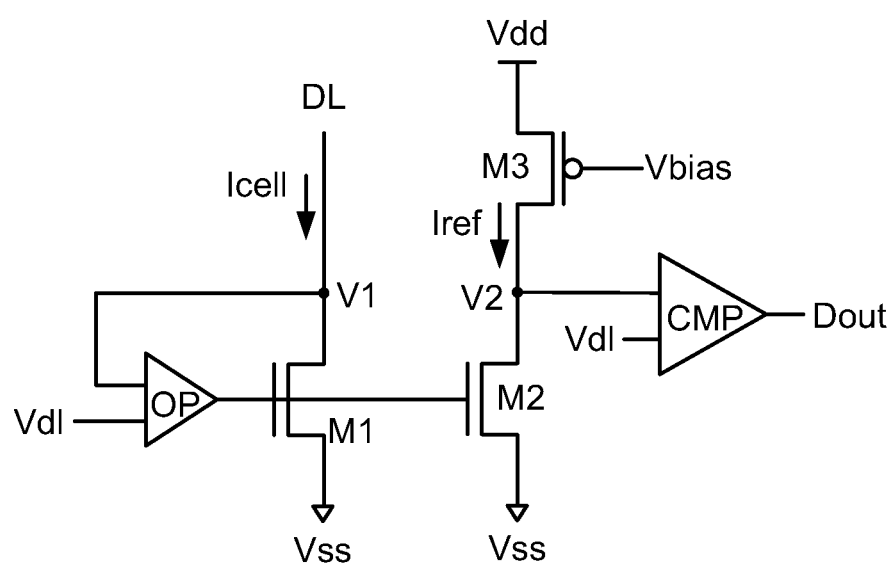
FIG. 1 (prior art) is a schematic circuit diagram illustrating a conventional current sensing amplifier.
Figure 2:
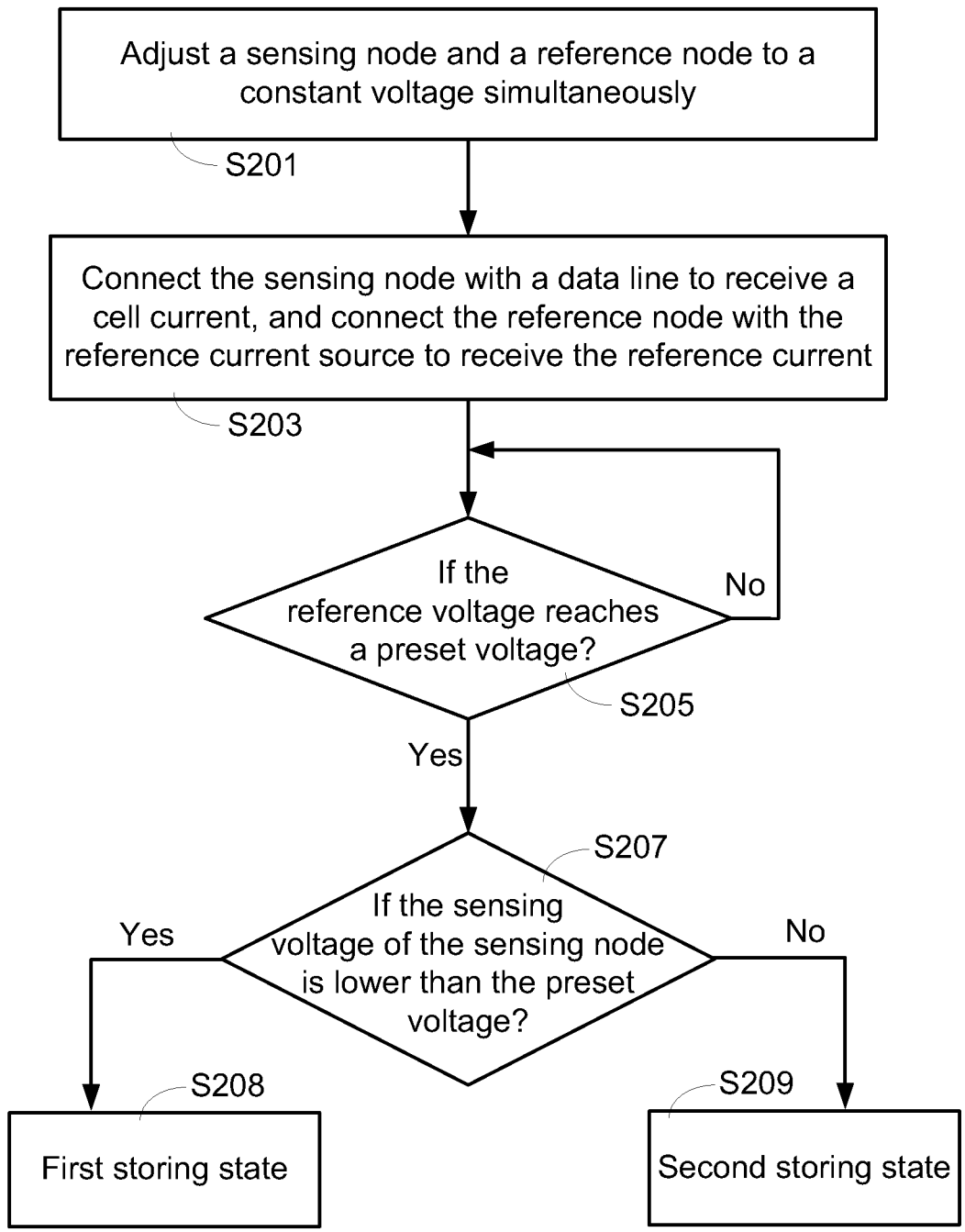
FIG. 2 is a schematic flowchart illustrating a sensing method of a current sensing amplifier according to an embodiment of the present invention.

The present invention provides a sensing method of a current sensing amplifier. FIG. 2 is a schematic flowchart illustrating a sensing method of a current sensing amplifier according to an embodiment of the present invention. Firstly, during a read cycle, a sensing node and a reference node are pre-charged to a constant voltage simultaneously (Step S201).

Then, the sensing node is connected with a data line to receive a cell current, and the reference node is connected with the reference current source to receive a reference current (Step S203). Consequently, the reference voltage of the reference node varies from the constant voltage.

Then, a reference voltage of the reference node is compared with a preset voltage, and a step S205 is performed to determine whether the reference voltage reaches the preset voltage.

When the reference voltage of the reference node reaches the preset voltage, the storing state of the cell is determined according to the relationship between the sensing voltage of the sensing node and the preset voltage (Step S207). That is, if the sensing voltage of the sensing node is lower than the preset voltage, the cell is in a first storing state such as an on state (Step S208). Whereas, if the sensing voltage of the sensing node is higher than the preset voltage, the cell is in a second storing state such as an off state (Step S209).

The current sensing amplifier for implementing the above sensing method will be illustrated in more details as follows.

Figure 3:
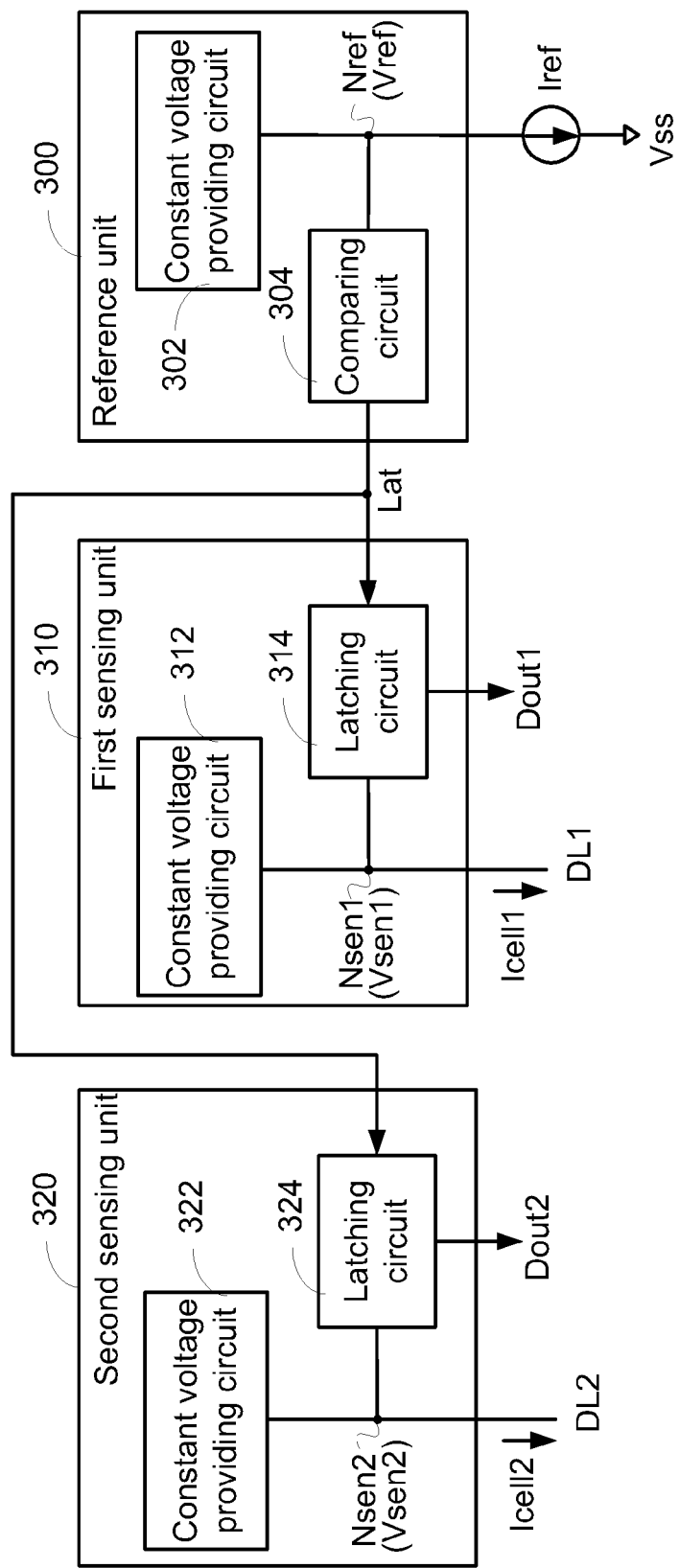
FIG. 3 is a schematic circuit block diagram illustrating the concepts of a current sensing amplifier of the present invention.

FIG. 3 is a schematic circuit block diagram illustrating the concepts of a current sensing amplifier of the present invention. As shown in FIG. 3, the current sensing amplifier comprises a reference unit 300, a first sensing unit 310, and a second sensing unit 320. The structures of the first sensing unit 310 and the second sensing unit 320 are substantially identical.

The reference unit 300 comprises a constant voltage providing circuit 302 and a comparing circuit 304. The constant voltage providing circuit 302 and the comparing circuit 304 are connected with a reference node Nref. During the read cycle, the reference node Nref is adjusted to a constant voltage by the constant voltage providing circuit 302. Then, the reference node Nref is connected with the reference current source to receive a reference current Iref. Meanwhile, the comparing circuit 304 starts to compare a reference voltage Vref of the reference node Nref with a preset voltage Vset. When the reference voltage Vref reaches the preset voltage Vset, the comparing circuit 304 issues a latching signal Lat to the first sensing unit 310 and the second sensing unit 320.

The first sensing unit 310 comprises a constant voltage providing circuit 312 and a latching circuit 314. The constant voltage providing circuit 312 and the latching circuit 314 are connected with a first sensing node Nsen1. During the read cycle, the first sensing node Nsen1 is adjusted to the constant voltage by the constant voltage providing circuit 312. Then, the first sensing node Nsen1 is connected with a first data line DL1 to receive a first cell current Icell1. When the latching signal Lat is received by the latching circuit 314, the latching circuit 314 generates a first output signal Dout1 according to the relationship between a first sensing voltage Vsen1 of the first sensing node Nsen1 and the preset voltage Vset. The first output signal Dout1 may denote the storing state of a first cell.

Similarly, the second sensing unit 320 comprises a constant voltage providing circuit 322 and a latching circuit 324. The constant voltage providing circuit 322 and the latching circuit 324 are connected with a second sensing node Nsen2. During the read cycle, the second sensing node Nsen2 is adjusted to the constant voltage by the constant voltage providing circuit 322. Then, the second sensing node Nsen2 is connected with a second data line DL2 to receive a second cell current Icell2. When the latching signal Lat is received by the latching circuit 324, the latching circuit 324 generates a second output signal Dout2 according to the relationship between a second sensing voltage Vsen2 of the second sensing node Nsen2 and the preset voltage Vset. The second output signal Dout2 may denote the storing state of a second cell.

For clarification and brevity, one reference unit 300 and two sensing units 310 and 320 are shown in FIG. 3. It is noted that the number of the sensing units may be varied according to the practical requirements. For example, in some other embodiments, the current sensing amplifier comprises a reference unit 300 and one sensing unit. Alternatively, in some other embodiments, the current sensing amplifier comprises a reference unit 300 and more than two sensing units.

Figure 4A:
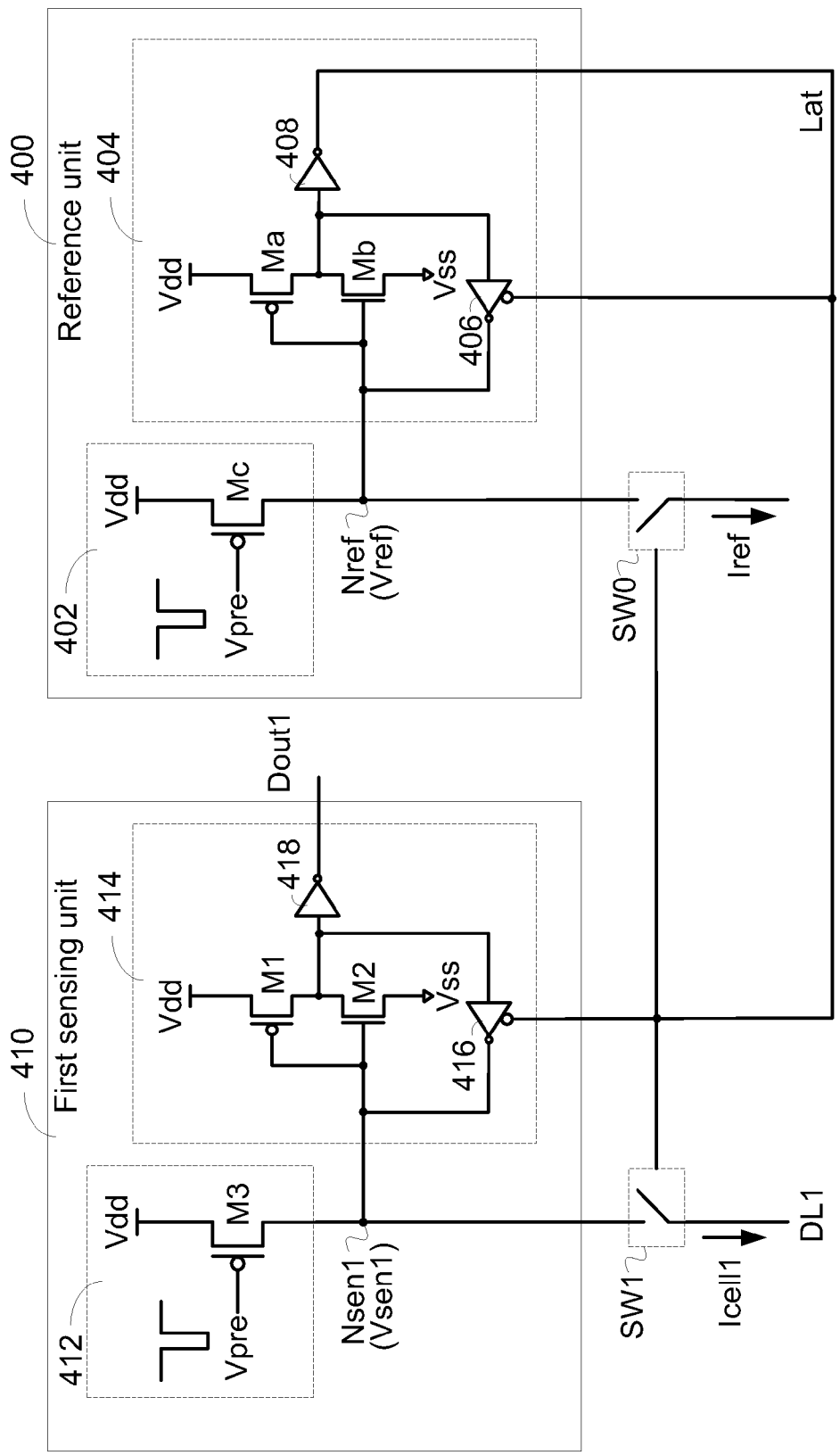
FIG. 4A is a schematic circuit diagram illustrating a current sensing amplifier according to a first embodiment of the present invention.
Figure 4B:
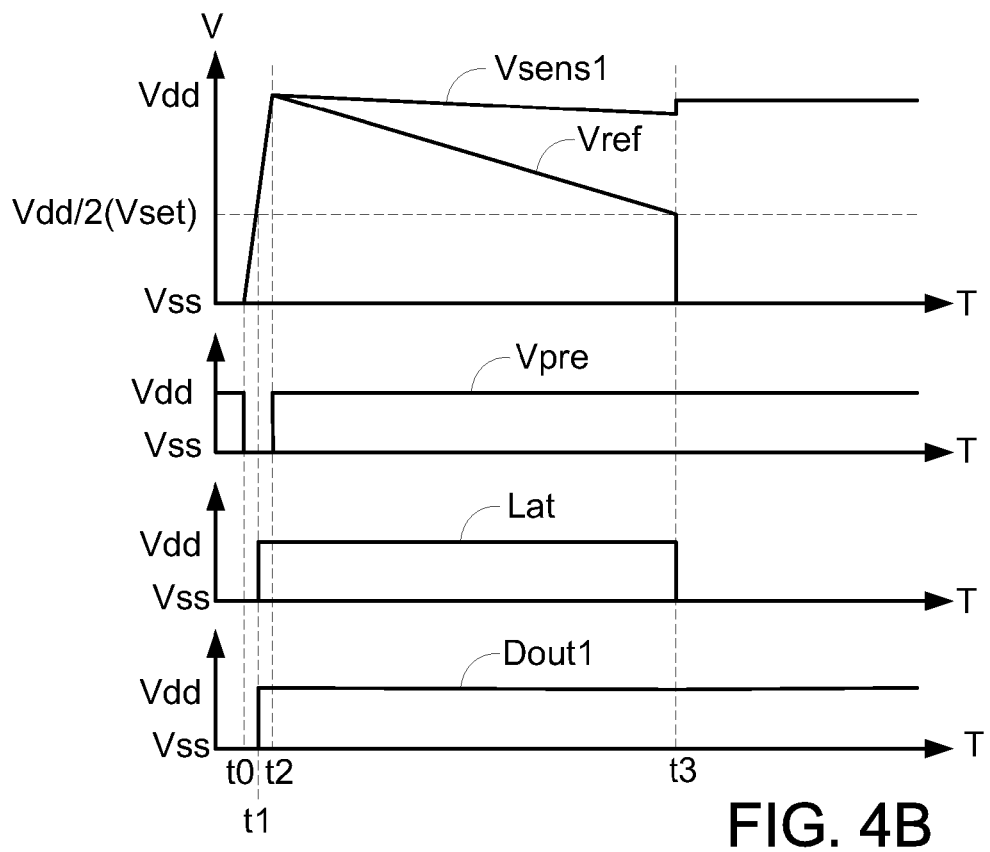
FIG. 4B is a schematic timing waveform diagram illustrating associated signals processed by the current sensing amplifier of FIG. 4A during the read cycle, in which the storing state of the cell is the off state.
Figure 4C:
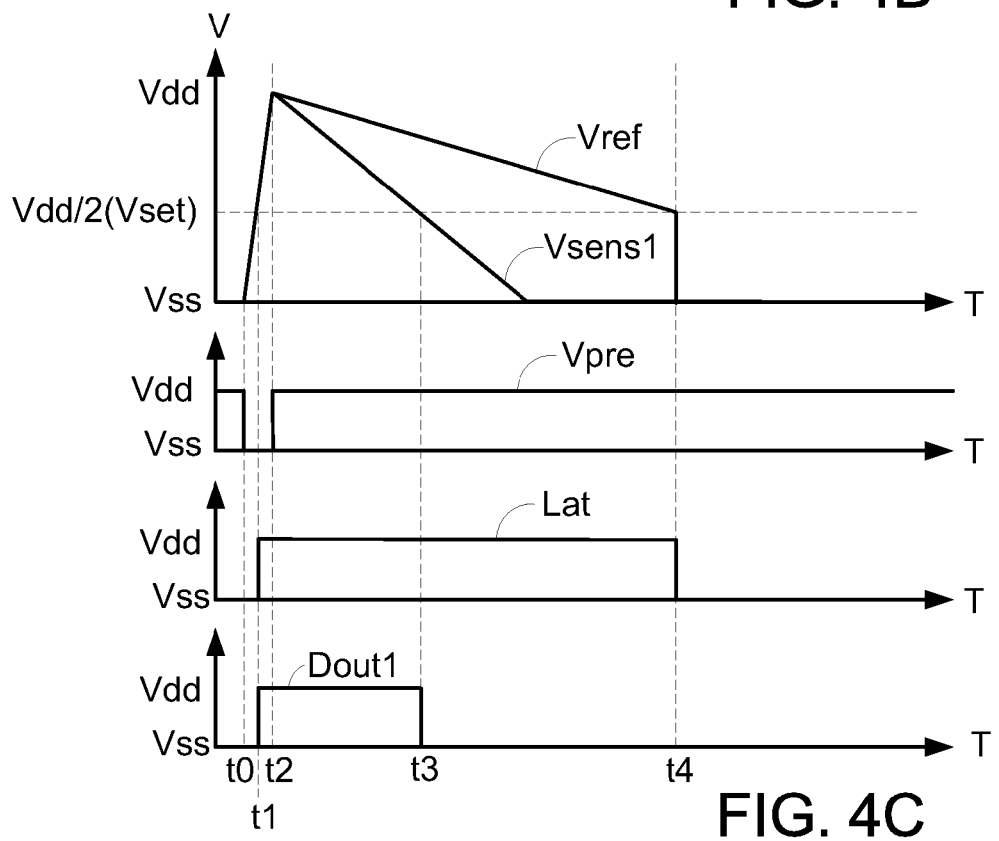
FIG. 4C is a schematic timing waveform diagram illustrating associated signals processed by the current sensing amplifier of FIG. 4A during the read cycle, in which the storing state of the cell is the on state.

FIG. 4A is a schematic circuit diagram illustrating a current sensing amplifier according to a first embodiment of the present invention. FIGS. 4B and 4C are schematic timing waveform diagrams illustrating associated signals processed by the current sensing amplifier according to the first embodiment of the present invention.

In FIG. 4A, only a reference unit 400 and a first sensing unit 410 are shown. It is noted that the current sensing amplifier may comprise a reference unit and plural sensing units with identical structures.

In this embodiment, the current sensing amplifier comprises the reference unit 400, the first sensing unit 410, and two switch elements SW0 and SW1. The reference unit 400 comprises a constant voltage providing circuit 402 and a comparing circuit 404. The constant voltage providing circuit 402 and the comparing circuit 404 are connected with a reference node Nref. The constant voltage providing circuit 402 comprises a transistor Mc. The source terminal of the transistor Mc is connected with a power supply voltage Vdd. The gate terminal of the transistor Mc receives an activating signal Vpre. The drain terminal of the transistor Mc is connected with the reference node Nref. Moreover, the comparing circuit 404 comprises two transistors Ma, Mb, and two inverters 406, 408. The source terminal of the transistor Ma is connected with the power supply voltage Vdd. The gate terminal of the transistor Ma is connected with the reference node Nref. The drain terminal of the transistor Mb is connected with the drain terminal of the transistor Ma. The source terminal of the transistor Mb is connected with a ground voltage Vss. The gate terminal of the transistor Mb is connected with the reference node Nref. The input terminal of the inverter 406 is connected with the drain terminal of the transistor Mb. The output terminal of the inverter 406 is connected with the reference node Nref. The input terminal of the inverter 408 is connected with the input terminal of the inverter 406. A latching signal Lat is outputted from the output terminal of the inverter 408. Moreover, the inverter 406 is controlled by the latching signal Lat. When the latching signal Lat is in a high-level state, the inverter 406 is disabled. When the latching signal Lat is in a low-level state, the inverter 406 is enabled.

The switch element SW0 is controlled by the latching signal Lat. When the latching signal Lat is in the high-level state, the switch element SW0 is in a closed state. Consequently, the reference node Nref is connected with the reference current source to receive a reference current Iref. When the latching signal Lat is in the low-level state, the switch element SW0 is in an open state. Consequently, the connection between the reference node Nref and the reference current source is interrupted.

The first sensing unit 410 comprises a constant voltage providing circuit 412 and a latching circuit 414. The constant voltage providing circuit 412 and the latching circuit 414 are connected with a first sensing node Nsen1. The constant voltage providing circuit 412 comprises a transistor M3. The source terminal of the transistor M3 is connected with the power supply voltage Vdd. The gate terminal of the transistor M3 receives the activating signal Vpre. The drain terminal of the transistor M3 is connected with the first sensing node Nsen1. Moreover, the latching circuit 414 comprises two transistors M1, M2, and two inverters 416, 418. The source terminal of the transistor M1 is connected with the power supply voltage Vdd. The gate terminal of the transistor M1 is connected with the first sensing node Nsen1. The drain terminal of the transistor M2 is connected with the drain terminal of the transistor M1. The source terminal of the transistor M2 is connected with the ground voltage Vss. The gate terminal of the transistor M2 is connected with the first sensing node Nsen1. The input terminal of the inverter 416 is connected with the drain terminal of the transistor M2. The output terminal of the inverter 416 is connected with the first sensing node Nsen1. The input terminal of the inverter 418 is connected with the input terminal of the inverter 416. A first output signal Dout1 is outputted from the output terminal of the inverter 418. Moreover, the inverter 416 is controlled by the latching signal Lat. When the latching signal Lat is in the high-level state, the inverter 416 is disabled. When the latching signal Lat is in the low-level state, the inverter 416 is enabled, and thus the latching circuit 414 is normally operated.

The switch element SW1 is controlled by the latching signal Lat. When the latching signal Lat is in the high-level state, the switch element SW1 is in a closed state. Consequently, the first sensing node Nsen1 is connected with a first data line DL1 to receive a first cell current Icell1. When the latching signal Lat is in the low-level state, the switch element SW1 is in an open state. Consequently, the connection between the first sensing node Nsen1 and the first data line DL1 is interrupted.

In this embodiment, the transistors Ma and Mb are collaboratively defined as an inverter. A transition voltage of this inverter is the preset voltage Vset. That is, if the reference voltage Vref is lower than the preset voltage Vset, this inverter issues a high voltage level. Whereas, if the reference voltage Vref is higher than the preset voltage Vset, this inverter issues a low voltage level. Moreover, the structure of the transistor M1 is identical to the structure of the transistor Ma, and the structure of the transistor M2 is identical to the structure of the transistor Mb. Moreover, the transistors M1 and M2 are collaboratively defined as an inverter. A transition voltage of this inverter is the preset voltage Vset. As known, by adjusting the sizes of the transistors Ma and Mb, the transition voltage is adjusted, and thus the preset voltage Vset is correspondingly adjusted. Hereinafter, the operations of the current sensing amplifier will be illustrated with reference to FIGS. 4B and 4C, wherein Vset=Vdd/2.

FIG. 4B is a schematic timing waveform diagram illustrating associated signals processed by the current sensing amplifier of FIG. 4A during the read cycle, in which the storing state of the cell is the off state.

From the time point t0 to the time point t2, the transistor Mc of the constant voltage providing circuit 402 of the reference unit 400 and the transistor M3 of the constant voltage providing circuit 412 of the first sensing unit 410 are shortly turned on according to the activating signal Vpre. Consequently, the reference node Nref and the first sensing node Nsen1 are pre-charged to the power supply voltage Vdd. That is, at the time point t2, both the reference voltage Vref of the reference node Nref and the first sensing voltage Vsen1 of the first sensing node Nsen1 are equal to the power supply voltage Vdd. Moreover, at the time point t1, the reference node Nref and the first sensing node Nsen1 are charged to the preset voltage Vset, the latching signal Lat and the first data line DL1 are changed to a high-level state, and at the time point t2, the transistor Mc and the transistor M3 are turned off according to the activating signal Vpre.

Moreover, at the time point t1, the latching signal Lat from the comparing circuit 404 is in the high-level state. Consequently, the latching circuit 414 is disabled, and the switch elements SW0 and SW1 are both in the closed state. Under this circumstance, the reference node Nref is connected with the reference current source to receive the reference current Iref, and the first sensing node Nsen1 is connected with the first data line DL1 to receive the first cell current Icell1. When the transistor Mc and the transistor M3 are turned off at the time point t2, the reference voltage Vref of the reference node Nref and the first sensing voltage Vsen1 of the first sensing node Nsen1 drop drown.

Since the storing state of the cell is the off state, the first cell current Icell1 is equal to the cell current I2. That is, the reference current Iref is higher than the first cell current Icell1. Consequently, after the time point t2, the reference voltage Vref of the reference node Nref drops down at a faster rate, while the first sensing voltage Vsen1 of the first sensing node Nsen1 drops down at a slower rate.

At the time point t3, the reference voltage Vref of the reference node Nref drops down to the preset voltage Vset. Correspondingly, the latching signal Lat from the comparing circuit 404 is in the low-level state. Since the latching signal Lat is in the low-level state, the switch elements SW0 and SW1 are both in the open state, and the latching circuit 414 of the first sensing unit 410 is enabled. Since the first sensing voltage Vsen1 of the first sensing node Nsen1 drops down at the slower rate, the first sensing voltage Vsen1 of the first sensing node Nsen1 is still higher than the preset voltage Vset. Correspondingly, the first output signal Dout1 from the latching circuit 414 is in the high-level state. Under this circumstance, the storing state of the cell connected with the first data line DL1 is the off state.

Since the latching signal Lat is in the low-level state at the time point t3, the inverter 406 and the inverter 416 are both enabled. Correspondingly, the magnitude of the reference voltage Vref is changed to be equal to the low voltage level outputted from the inverter 406, and the magnitude of the first sensing voltage Vsen1 is changed to be equal to the high voltage level outputted from the inverter 416.

FIG. 4C is a schematic timing waveform diagram illustrating associated signals processed by the current sensing amplifier of FIG. 4A during the read cycle, in which the storing state of the cell is the on state.

From the time point t0 to the time point t2, the transistor Mc of the constant voltage providing circuit 402 of the reference unit 400 and the transistor M3 of the constant voltage providing circuit 412 of the first sensing unit 410 are shortly turned on according to the activating signal Vpre. Consequently, the reference node Nref and the first sensing node Nsen1 are pre-charged to the power supply voltage Vdd. That is, at the time point t2, both the voltage of the reference node Nref and the voltage of the first sensing node Nsen1 are equal to the power supply voltage Vdd. Moreover, at the time point t1, the reference node Nref and the first sensing node Nsen1 are charged to the preset voltage Vset, the latching signal Lat and the first data line DL1 are changed to a high-level state, and at the time point t2, the transistor Mc and the transistor M3 are turned off according to the activating signal Vpre.

Moreover, at the time point t1, the latching signal Lat from the comparing circuit 404 is in the high-level state. Consequently, the latching circuit 414 is disabled, and the switch elements SW0 and SW1 are both in the closed state. Under this circumstance, the reference node Nref is connected with the reference current source to receive the reference current Iref, and the first sensing node Nsen1 is connected with the first data line DL1 to receive the first cell current Icell1. When the transistor Mc and the transistor M3 are turned off at the time point t2, the reference voltage Vref of the reference node Nref and the first sensing voltage Vsen1 of the first sensing node Nsen1 drop drown.

Since the storing state of the cell is the on state, the first cell current Icell1 is equal to the cell current I1. That is, the reference current Iref is lower than the first cell current Icell1. Consequently, after the time point t2, the reference voltage Vref of the reference node Nref drops down at a slower rate, while the first sensing voltage Vsen1 of the first sensing node Nsen1 drops down at a faster rate.

The first sensing voltage Vsen1 of the first sensing node Nsen1 drops down to the preset voltage Vset at the time point t3, and continuously drops down. At the time point t4, the reference voltage Vref of the reference node Nref drops down to the preset voltage Vset. Correspondingly, the latching signal Lat from the comparing circuit 404 is in the low-level state. Since the latching signal Lat is in the low-level state, the switch elements SW0 and SW1 are both in the open state, and the latching circuit 414 of the first sensing unit 410 is enabled. Since the first sensing voltage Vsen1 of the first sensing node Nsen1 drops down at the faster rate, the first sensing voltage Vsen1 of the first sensing node Nsen1 is lower than the preset voltage Vset. Correspondingly, the first output signal Dout1 from the latching circuit 414 is in the low-level state. Under this circumstance, the storing state of the cell connected with the first data line DL1 is the on state.

Since the latching signal Lat is in the low-level state at the time point t4, the inverter 406 and the inverter 416 are both enabled. Correspondingly, the magnitude of the reference voltage Vref is changed to be equal to the low voltage level outputted from the inverter 406, and the magnitude of the first sensing voltage Vsen1 is changed to be equal to the low voltage level outputted from the inverter 416.

From the above discussions, a reference current source is provided to generate a reference current Iref. The magnitude of the reference current Iref is in the range between the on-state cell current I1 and the off-state cell current I2. After the sensing node and the reference node are pre-charged to the constant voltage, the sensing node and the reference node are connected with the data line and the reference current source, respectively. Then, the storing state of the cell is determined according to the decreasing speed of the sensing voltage of the sensing node and the decreasing speed of the reference voltage of the reference node.

Figure 5A:
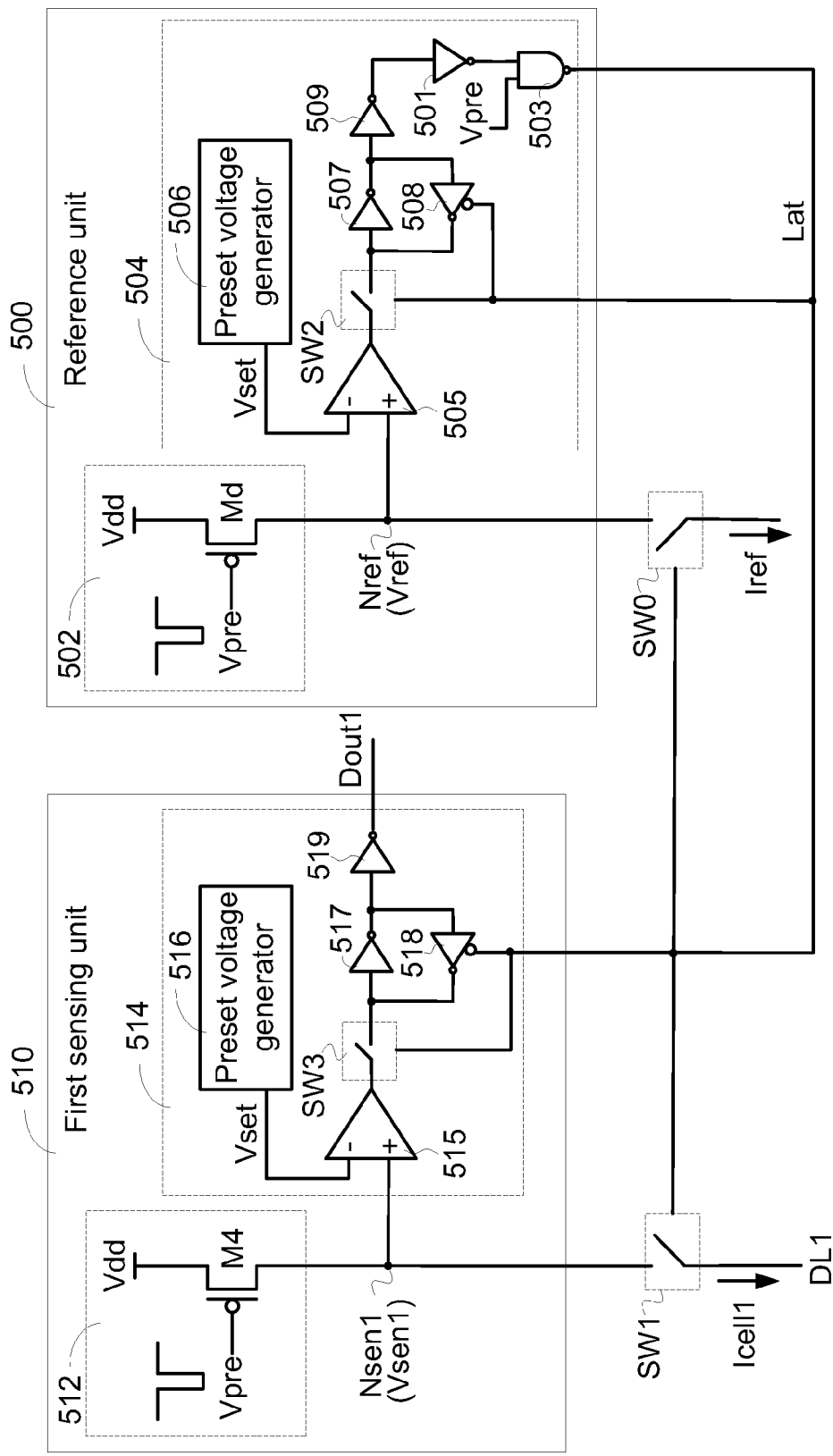
FIG. 5A is a schematic circuit diagram illustrating a current sensing amplifier according to a second embodiment of the present invention.
Figure 5B:
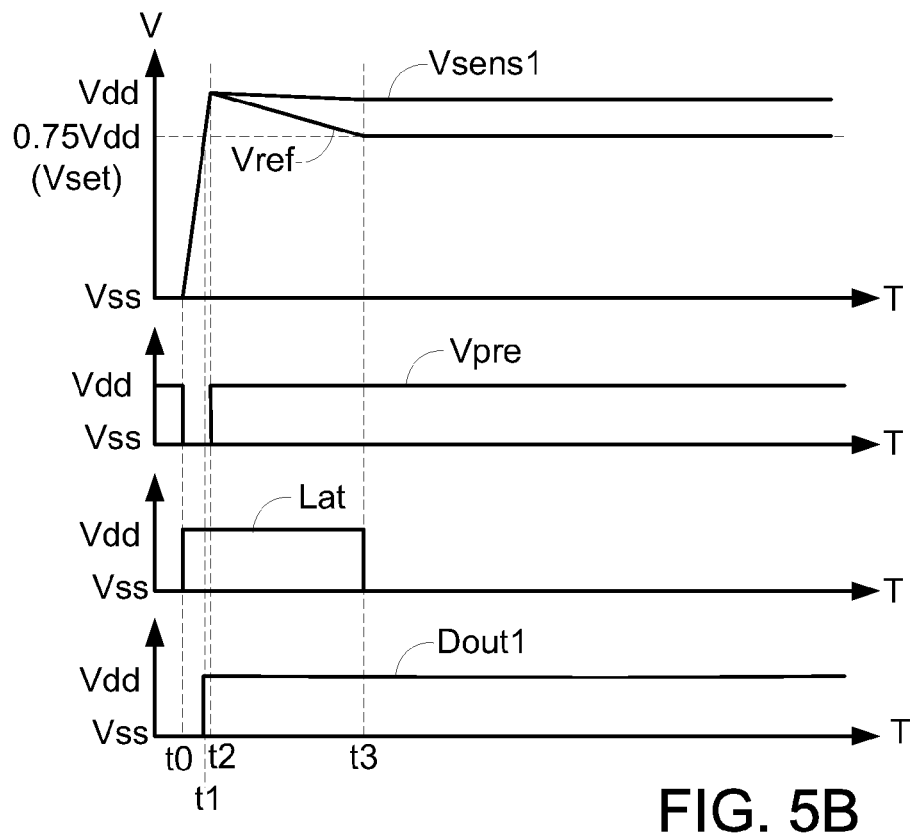
FIG. 5B is a schematic timing waveform diagram illustrating associated signals processed by the current sensing amplifier of FIG. 5A during the read cycle, in which the storing state of the cell is the off state.
Figure 5C:
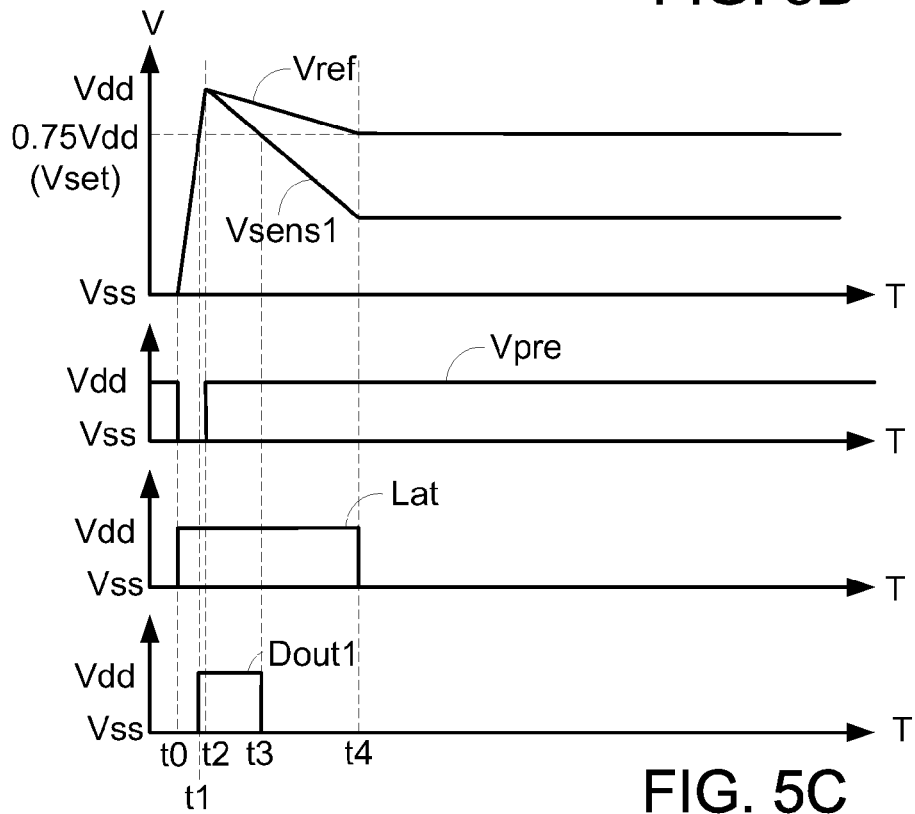
FIG. 5C is a schematic timing waveform diagram illustrating associated signals processed by the current sensing amplifier of FIG. 5A during the read cycle, in which the storing state of the cell is the on state.

FIG. 5A is a schematic circuit diagram illustrating a current sensing amplifier according to a second embodiment of the present invention. FIGS. 5B and 5C are schematic timing waveform diagrams illustrating associated signals processed by the current sensing amplifier according to the second embodiment of the present invention.

In FIG. 5A, only a reference unit 500 and a first sensing unit 510 are shown. It is noted that the current sensing amplifier may comprise a reference unit and plural sensing units.

In this embodiment, the current sensing amplifier comprises the reference unit 500, the first sensing unit 510, and two switch elements SW0 and SW1. The reference unit 500 comprises a constant voltage providing circuit 502 and a comparing circuit 504. The constant voltage providing circuit 502 and the comparing circuit 504 are connected with a reference node Nref. The constant voltage providing circuit 502 comprises a transistor Md. The source terminal of the transistor Md is connected with a power supply voltage Vdd. The gate terminal of the transistor Md receives an activating signal Vpre. The drain terminal of the transistor Md is connected with the reference node Nref. Moreover, the comparing circuit 504 comprises a preset voltage generator 506, a comparator 505, a switch element SW2, a NAND gate 503 and four inverters 507, 508, 509, 501. The positive input terminal of the comparator 505 is connected with the reference node Nref for receiving a reference voltage Vref. The negative terminal of the comparator 505 is connected with the preset voltage generator 506 for receiving a preset voltage Vset from the preset voltage generator 506. The switch element SW2 is connected between the output terminal of the comparator 505 and the input terminal of the inverter 507. The input terminal of the inverter 508 is connected with the output terminal of the inverter 507 and the input terminal of the inverter 507 is connected with the output terminal of the inverter 508. The input terminal of the inverter 509 is connected with the output terminal of the inverter 507, and input terminal of the inverter 501 is connected with the output terminal of the inverter 509. The first input terminal of the NAND gate 503 is connected with the output terminal of the inverter 501, the second input terminal of the NAND gate 503 receives the activating signal Vpre, and a latching signal Lat is outputted from the output terminal of the NAND gate 503. Moreover, the inverter 508 and the switch element SW2 are controlled by the latching signal Lat. When the latching signal Lat is in a high-level state, the inverter 508 is disabled. When the latching signal Lat is in a low-level state, the inverter 508 is enabled. When the latching signal Lat is in the high-level state, the switch element SW2 is in a closed state. When the latching signal Lat is in the low-level state, the switch element SW2 is in an open state.

The switch element SW0 is controlled by the latching signal Lat. When the latching signal Lat is in the high-level state, the switch element SW0 is in a closed state. Consequently, the reference node Nref is connected with the reference current source to receive a reference current Iref. When the latching signal Lat is in the low-level state, the switch element SW0 is in an open state. Consequently, the connection between the reference node Nref and the reference current source is interrupted.

The first sensing unit 510 comprises a constant voltage providing circuit 512 and a latching circuit 514. The constant voltage providing circuit 512 and the latching circuit 514 are connected with a first sensing node Nsen1. The constant voltage providing circuit 512 comprises a transistor M4. The source terminal of the transistor M4 is connected with the power supply voltage Vdd. The gate terminal of the transistor M4 receives the activating signal Vpre. The drain terminal of the transistor M4 is connected with the first sensing node Nsen1 for receiving a first sensing voltage Vsen1. Moreover, the latching circuit 514 comprises a preset voltage generator 516, a comparator 515, a switch element SW3, and three inverters 517, 518, 519. The positive input terminal of the comparator 515 is connected with the first sensing node Nsen1 for receiving a first sensing voltage Vsen1. The negative terminal of the comparator 515 is connected with the preset voltage generator 516 for receiving the preset voltage Vset from the preset voltage generator 516. The switch element SW3 is connected between the output terminal of the comparator 515 and the input terminal of the inverter 517. The input terminal of the inverter 518 is connected with the output terminal of the inverter 517 and the input terminal of the inverter 517 is connected with the output terminal of the inverter 518. The input terminal of the inverter 519 is connected with the output terminal of the inverter 517. A first output signal Dout1 is outputted from the output terminal of the inverter 519. Moreover, the inverter 518 and the switch element SW3 are controlled by the latching signal Lat. When the latching signal Lat is in the high-level state, the inverter 518 is disabled. When the latching signal Lat is in the low-level state, the inverter 518 is enabled, and thus the latching circuit 514 is normally operated. Furthermore, the switch element SW3 is controlled by the latching signal Lat. When the latching signal Lat is in the high-level state, the switch element SW3 is in a closed state. When the latching signal Lat is in the low-level state, the switch element SW3 is in an open state.

The switch element SW1 is controlled by the latching signal Lat. When the latching signal Lat is in the high-level state, the switch element SW1 is in a closed state. Consequently, the first sensing node Nsen1 is connected with a first data line DL1 to receive a first cell current Icell1. When the latching signal Lat is in the low-level state, the switch element SW1 is in an open state. Consequently, the connection between the first sensing node Nsen1 and the first data line DL1 is interrupted.

In this embodiment, the preset voltage generator 506 of the reference unit 500 and the preset voltage generator 516 of the first sensing unit 510 are identical, and are used for providing the preset voltage Vset. Moreover, the preset voltage Vset may be adjusted by the preset voltage generators 506 and 516. Hereinafter, the operations of the current sensing amplifier will be illustrated with reference to FIGS. 5B and 5C, wherein Vset=0.75×Vdd.

FIG. 5B is a schematic timing waveform diagram illustrating associated signals processed by the current sensing amplifier of FIG. 5A during the read cycle, in which the storing state of the cell is the off state.

From the time point t0 to the time point t2, the transistor Md of the constant voltage providing circuit 502 of the reference unit 500 and the transistor M4 of the constant voltage providing circuit 512 of the first sensing unit 510 are shortly turned on according to the activating signal Vpre. Consequently, the reference node Nref and the first sensing node Nsen1 are pre-charged to the power supply voltage Vdd. That is, at the time point t2, both the reference voltage Vref of the reference node Nref and the first sensing voltage Vsen1 of the first sensing node Nsen1 are equal to the power supply voltage Vdd. Moreover, at the time point t2, the transistor Md and the transistor M4 are turned off according to the activating signal Vpre. Also, at the time point t0, the latching signal Lat outputted by the NAND gate 503 is changed to a high-level state. At the time point t1, the first sensing node Nsen1 is charged to the preset voltage Vset, the first data line DL1 are changed to the high-level state.

Moreover, at the time point t0, the latching signal Lat from the comparing circuit 504 is in the high-level state. Consequently, the latching circuit 514 and the inverter 508 are disabled, and the switch elements SW0, SW1, SW2 and SW3 are in the closed state. Under this circumstance, the reference node Nref is connected with the reference current source to receive the reference current Iref, and the first sensing node Nsen1 is connected with the first data line DL1 to receive the first cell current Icell1. When the transistor Md and the transistor M4 are turned off at the time point t2, the reference voltage Vref of the reference node Nref and the first sensing voltage Vsen1 of the first sensing node Nsen1 drop drown.

Since the storing state of the cell is the off state, the first cell current Icell1 is equal to the cell current I2. That is, the reference current Iref is higher than the first cell current Icell1. Consequently, after the time point t2, the reference voltage Vref of the reference node Nref drops down at a faster rate, while the first sensing voltage Vsen1 of the first sensing node Nsen1 drops down at a slower rate.

At the time point t3, the reference voltage Vref of the reference node Nref drops down to the preset voltage Vset. Correspondingly, the latching signal Lat from the comparing circuit 504 is in the low-level state. Since the latching signal Lat is in the low-level state, the switch elements SW0, SW1, SW2 and SW3 are in the open state, and the latching circuit 514 of the first sensing unit 510 and the inverter 508 are enabled. Since the first sensing voltage Vsen1 of the first sensing node Nsen1 drops down at the slower rate, the first sensing voltage Vsen1 of the first sensing node Nsen1 is still higher than the preset voltage Vset. Correspondingly, the first output signal Dout1 from the latching circuit 514 is in the high-level state. Under this circumstance, the storing state of the cell connected with the first data line DL1 is the off state.

FIG. 5C is a schematic timing waveform diagram illustrating associated signals processed by the current sensing amplifier of FIG. 5A during the read cycle, in which the storing state of the cell is the on state.

From the time point t0 to the time point t2, the transistor Md of the constant voltage providing circuit 502 of the reference unit 500 and the transistor M4 of the constant voltage providing circuit 512 of the first sensing unit 510 are shortly turned on according to the activating signal Vpre. Consequently, the reference node Nref and the first sensing node Nsen1 are pre-charged to the power supply voltage Vdd. That is, at the time point t2, both the reference voltage Vref of the reference node Nref and the first sensing voltage Vsen1 of the first sensing node Nsen1 are equal to the power supply voltage Vdd. Moreover, at the time point t2, the transistor Md and the transistor M4 are turned off according to the activating signal Vpre. Also, at the time point t0, the latching signal Lat outputted by the NAND gate 503 is changed to a high-level state. At the time point t1, the first sensing node Nsen1 is charged to the preset voltage Vset, the first data line DL1 are changed to the high-level state.

Moreover, at the time point t0, the latching signal Lat from the comparing circuit 504 is in the high-level state. Consequently, the latching circuit 514 and the inverter 508 are disabled, and the switch elements SW0, SW1, SW2 and SW3 are in the closed state. Under this circumstance, the reference node Nref is connected with the reference current source to receive the reference current Iref, and the first sensing node Nsen1 is connected with the first data line DL1 to receive the first cell current Icell1. When the transistor Md and the transistor M4 are turned off at the time point t2, the reference voltage Vref of the reference node Nref and the first sensing voltage Vsen1 of the first sensing node Nsen1 drop drown.

Since the storing state of the cell is the on state, the first cell current Icell1 is equal to the cell current I1. That is, the reference current Iref is lower than the first cell current Icell1. Consequently, after the time point t2, the reference voltage Vref of the reference node Nref drops down at a slower rate, while the first sensing voltage Vsen1 of the first sensing node Nsen1 drops down at a faster rate.

The first sensing voltage Vsen1 of the first sensing node Nsen1 drops down to the preset voltage Vset at the time point t3, and continuously drops down. At the time point t4, the reference voltage Vref of the reference node Nref drops down to the preset voltage Vset. Correspondingly, the latching signal Lat from the comparing circuit 504 is in the low-level state. Since the latching signal Lat is in the low-level state, the switch elements SW0, SW1, SW2 and SW3 are in the open state, and the latching circuit 514 of the first sensing unit 510 and the inverter 508 are enabled. Since the first sensing voltage Vsen1 of the first sensing node Nsen1 drops down at the faster rate, the first sensing voltage Vsen1 of the first sensing node Nsen1 is lower than the preset voltage Vset. Correspondingly, the first output signal Dout1 from the latching circuit 514 is in the low-level state. Under this circumstance, the storing state of the cell connected with the first data line DL1 is the on state.

Figure 6A:
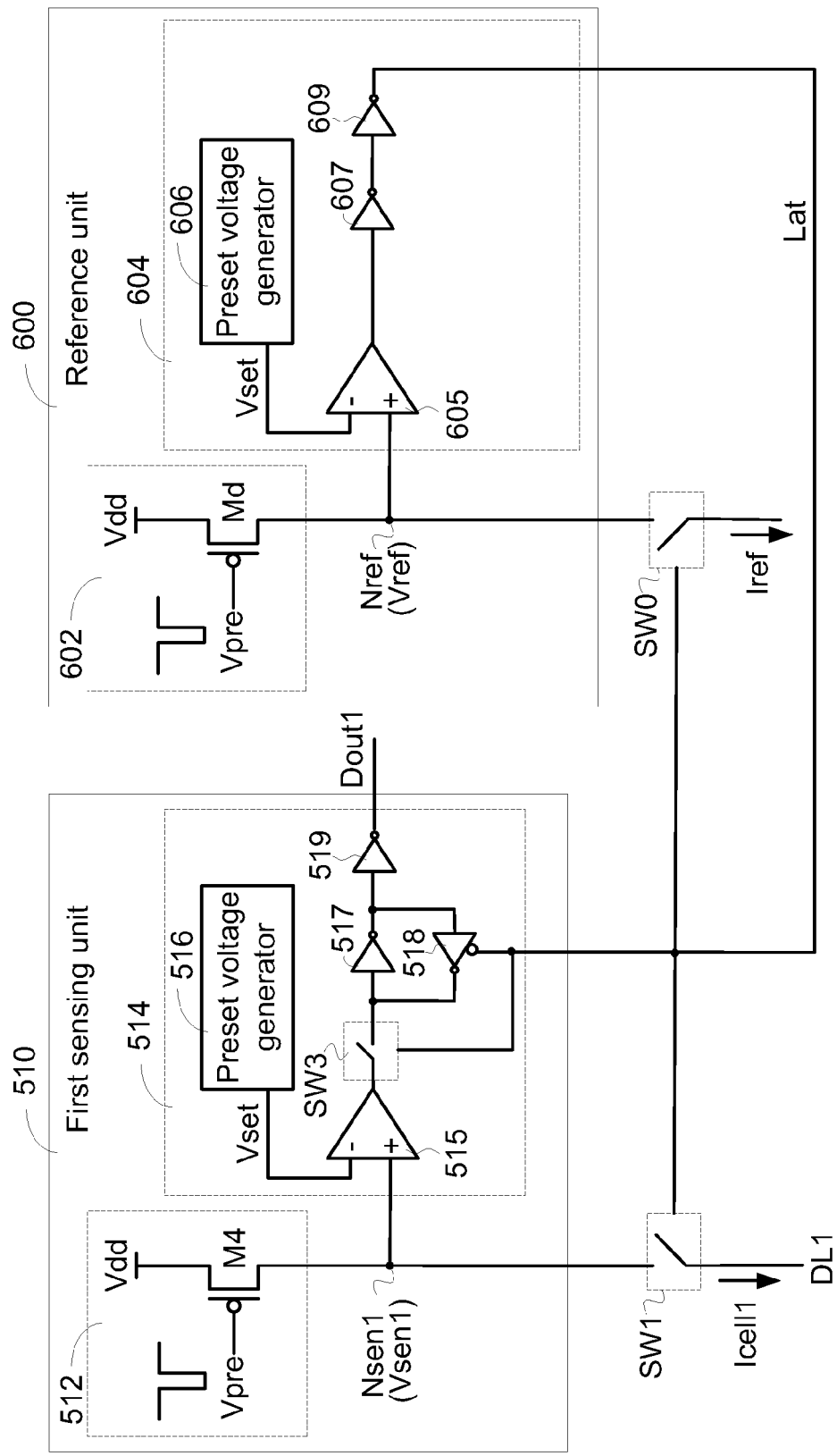
FIG. 6A is a schematic circuit diagram illustrating a current sensing amplifier according to a third embodiment of the present invention.
Figure 6B:
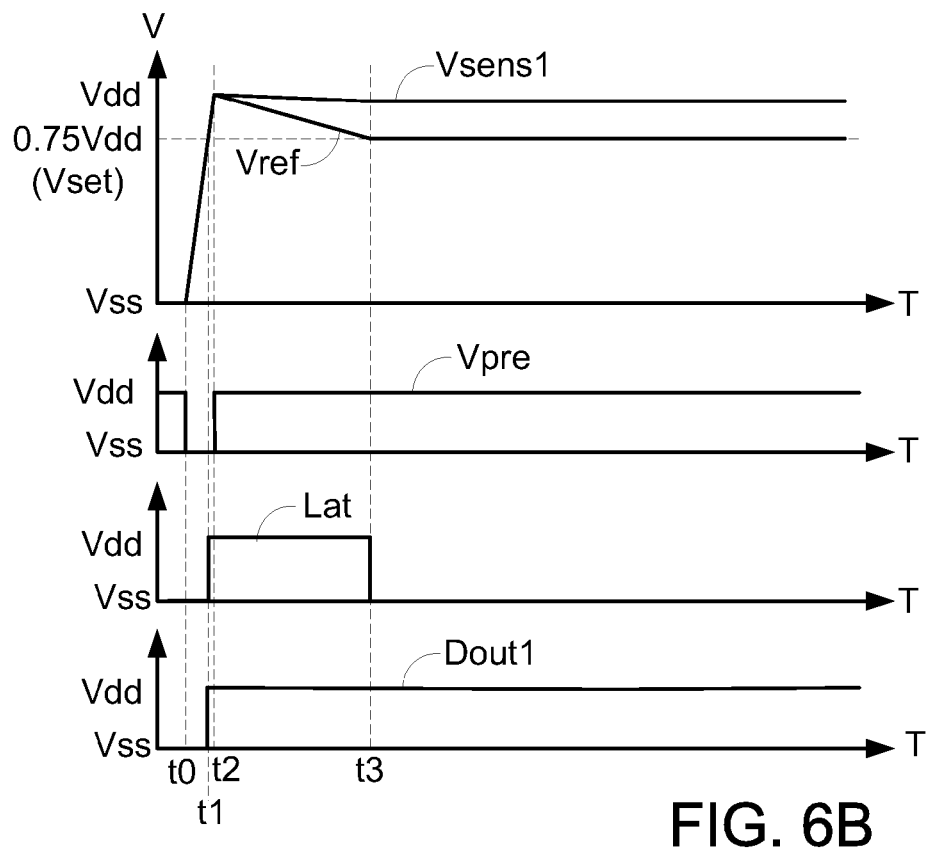
FIG. 6B is a schematic timing waveform diagram illustrating associated signals processed by the current sensing amplifier of FIG. 6A during the read cycle, in which the storing state of the cell is the off state.
Figure 6C:
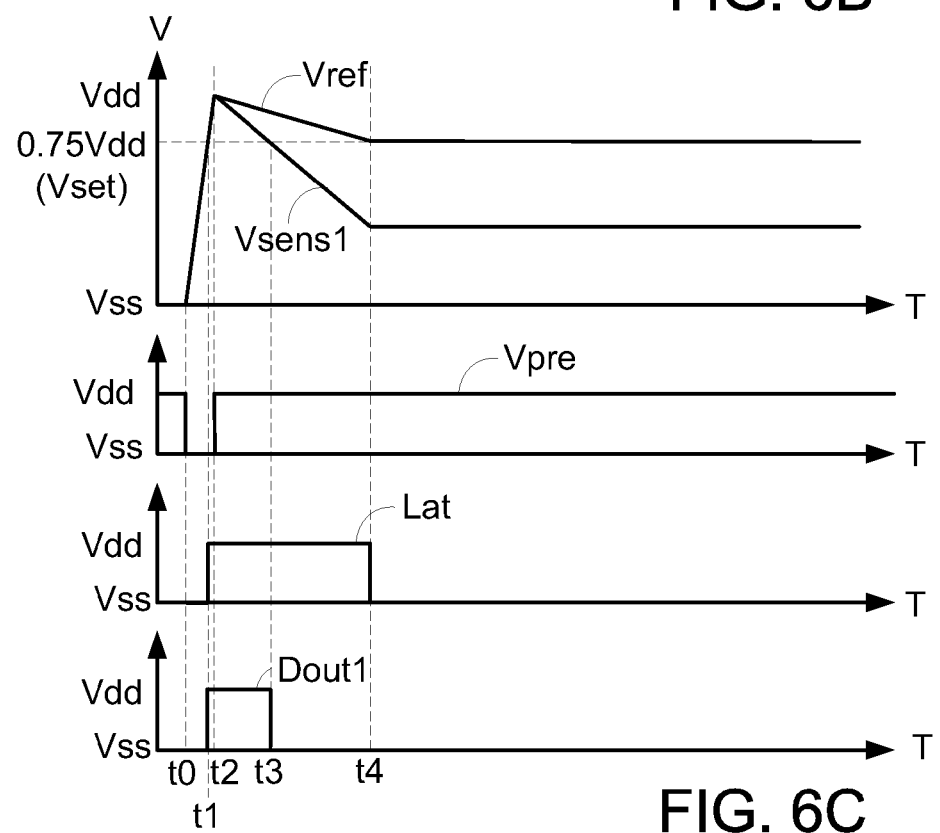
FIG. 6C is a schematic timing waveform diagram illustrating associated signals processed by the current sensing amplifier of FIG. 6A during the read cycle, in which the storing state of the cell is the on state.

FIG. 6A is a schematic circuit diagram illustrating a current sensing amplifier according to a third embodiment of the present invention. FIGS. 6B and 6C are schematic timing waveform diagrams illustrating associated signals processed by the current sensing amplifier according to the third embodiment of the present invention.

In FIG. 6A, only a reference unit 600 and a first sensing unit 510 are shown. It is noted that the current sensing amplifier may comprise a reference unit and plural sensing units. Also, the first sensing unit 510 in FIG. 5A is the same with the first sensing unit 510 in FIG. 6A, and is not redundantly described.

In this embodiment, the current sensing amplifier comprises the reference unit 600, the first sensing unit 510, and two switch elements SW0 and SW1. The reference unit 600 comprises a constant voltage providing circuit 602 and a comparing circuit 604. The constant voltage providing circuit 602 and the comparing circuit 604 are connected with a reference node Nref. The constant voltage providing circuit 602 comprises a transistor Md. The source terminal of the transistor Md is connected with a power supply voltage Vdd. The gate terminal of the transistor Md receives an activating signal Vpre. The drain terminal of the transistor Md is connected with the reference node Nref. Moreover, the comparing circuit 604 comprises a preset voltage generator 606, a comparator 605 and two inverters 607, 609. The positive input terminal of the comparator 605 is connected with the reference node Nref for receiving a reference voltage Vref. The negative terminal of the comparator 605 is connected with the preset voltage generator 606 for receiving a preset voltage Vset from the preset voltage generator 606. The input terminal of the inverter 607 is connected with the output terminal of the comparator 605, and input terminal of the inverter 609 is connected with the output terminal of the inverter 607. A latching signal Lat is outputted from the output terminal of the inverter 609.

The switch element SW0 is in an closed state once the reference unit 600 is enabled by the activating signal Vpre. Consequently, the reference node Nref is connected with the reference current source to receive a reference current Iref. When the reference unit 600 is disabled, the switch element SW0 is in an open state. Consequently, the connection between the reference node Nref and the reference current source is interrupted.

The switch element SW1 is controlled by the latching signal Lat. When the latching signal Lat is in the high-level state, the switch element SW1 is in a closed state. Consequently, the first sensing node Nsen1 is connected with a first data line DL1 to receive a first cell current Icell1. When the latching signal Lat is in the low-level state, the switch element SW1 is in an open state. Consequently, the connection between the first sensing node Nsen1 and the first data line DL1 is interrupted.

In this embodiment, the preset voltage generator 606 of the reference unit 600 and the preset voltage generator 516 of the first sensing unit 510 are identical, and are used for providing the preset voltage Vset. Moreover, the preset voltage Vset may be adjusted by the preset voltage generators 606 and 516. Hereinafter, the operations of the current sensing amplifier will be illustrated with reference to FIGS. 6B and 6C, wherein Vset=0.75×Vdd.

FIG. 6B is a schematic timing waveform diagram illustrating associated signals processed by the current sensing amplifier of FIG. 6A during the read cycle, in which the storing state of the cell is the off state.

At the time point t0, the switch element SW0 is in a closed state when the reference unit 600 is enabled by the activating signal Vpre. Moreover, from the time point t0 to the time point t2, the transistor Md of the constant voltage providing circuit 602 of the reference unit 600 and the transistor M4 of the constant voltage providing circuit 512 of the first sensing unit 510 are shortly turned on according to the activating signal Vpre. Consequently, the reference node Nref and the first sensing node Nsen1 are pre-charged to the power supply voltage Vdd. That is, at the time point t2, both the reference voltage Vref of the reference node Nref and the first sensing voltage Vsen1 of the first sensing node Nsen1 are equal to the power supply voltage Vdd. Moreover, at the time point t1, the reference node Nref and the first sensing node Nsen1 are charged to the preset voltage Vset, the latching signal Lat and the first data line DL1 are changed to a high-level state, and at the time point t2, the transistor Md and the transistor M4 are turned off according to the activating signal Vpre.

Moreover, at the time point t1, the latching signal Lat from the comparing circuit 604 is in the high-level state. Consequently, the latching circuit 514 is disabled, and the switch elements SW1 and SW3 are in the closed state. Under this circumstance, the reference node Nref is connected with the reference current source to receive the reference current Iref, and the first sensing node Nsen1 is connected with the first data line DL1 to receive the first cell current Icell1. When the transistor Md and the transistor M4 are turned off at the time point t2, the reference voltage Vref of the reference node Nref and the first sensing voltage Vsen1 of the first sensing node Nsen1 drop drown.

Since the storing state of the cell is the off state, the first cell current Icell1 is equal to the cell current I2. That is, the reference current Iref is higher than the first cell current Icell1. Consequently, after the time point t2, the reference voltage Vref of the reference node Nref drops down at a faster rate, while the first sensing voltage Vsen1 of the first sensing node Nsen1 drops down at a slower rate.

At the time point t3, the reference voltage Vref of the reference node Nref drops down to the preset voltage Vset. Correspondingly, the latching signal Lat from the comparing circuit 604 is in the low-level state. Since the latching signal Lat is in the low-level state, the switch elements SW1 and SW3 are in the open state, and the latching circuit 514 of the first sensing unit 510 is enabled. Since the first sensing voltage Vsen1 of the first sensing node Nsen1 drops down at the slower rate, the first sensing voltage Vsen1 of the first sensing node Nsen1 is still higher than the preset voltage Vset. Correspondingly, the first output signal Dout1 from the latching circuit 514 is in the high-level state. Under this circumstance, the storing state of the cell connected with the first data line DL1 is the off state.

FIG. 6C is a schematic timing waveform diagram illustrating associated signals processed by the current sensing amplifier of FIG. 6A during the read cycle, in which the storing state of the cell is the on state.

At the time point t0, the switch element SW0 is in a closed state when the reference unit 600 is enabled by the activating signal Vpre. Moreover, from the time point t0 to the time point t2, the transistor Md of the constant voltage providing circuit 602 of the reference unit 600 and the transistor M4 of the constant voltage providing circuit 512 of the first sensing unit 510 are shortly turned on according to the activating signal Vpre. Consequently, the reference node Nref and the first sensing node Nsen1 are pre-charged to the power supply voltage Vdd. That is, at the time point t2, both the reference voltage Vref of the reference node Nref and the first sensing voltage Vsen1 of the first sensing node Nsen1 are equal to the power supply voltage Vdd. Moreover, at the time point t1, the reference node Nref and the first sensing node Nsen1 are charged to the preset voltage Vset, the latching signal Lat and the first data line DL1 are changed to a high-level state, and at the time point t2, the transistor Md and the transistor M4 are turned off according to the activating signal Vpre.

Moreover, at the time point t1, the latching signal Lat from the comparing circuit 604 is in the high-level state. Consequently, the latching circuit 514 is disabled, and the switch elements SW1 and SW3 are in the closed state. Under this circumstance, the reference node Nref is connected with the reference current source to receive the reference current Iref, and the first sensing node Nsen1 is connected with the first data line DL1 to receive the first cell current Icell1. When the transistor Md and the transistor Md are turned off at the time point t2, the reference voltage Vref of the reference node Nref and the first sensing voltage Vsen1 of the first sensing node Nsen1 drop drown.

Since the storing state of the cell is the on state, the first cell current Icell1 is equal to the cell current I1. That is, the reference current Iref is lower than the first cell current Icell1. Consequently, after the time point t2, the reference voltage Vref of the reference node Nref drops down at a slower rate, while the first sensing voltage Vsen1 of the first sensing node Nsen1 drops down at a faster rate.

The first sensing voltage Vsen1 of the first sensing node Nsen1 drops down to the preset voltage Vset at the time point t3, and continuously drops down. At the time point t4, the reference voltage Vref of the reference node Nref drops down to the preset voltage Vset. Correspondingly, the latching signal Lat from the comparing circuit 504 is in the low-level state. Since the latching signal Lat is in the low-level state, the switch elements SW1 and SW3 are in the open state, and the latching circuit 514 of the first sensing unit 510 is enabled. Since the first sensing voltage Vsen1 of the first sensing node Nsen1 drops down at the faster rate, the first sensing voltage Vsen1 of the first sensing node Nsen1 is lower than the preset voltage Vset. Correspondingly, the first output signal Dout1 from the latching circuit 514 is in the low-level state. Under this circumstance, the storing state of the cell connected with the first data line DL1 is the on state.

From the above discussions, the preset voltage Vset of the current sensing amplifier of the second embodiment can be adjusted to a higher value. Consequently, the sensing time of the current sensing amplifier can be shortened.

In the above embodiments, the storing state of the cell with the n-type floating gate transistor is sensed by the current sensing amplifier. Alternatively, the concept of the present invention may be applied to the current sensing amplifier for sensing the storing state of the cell with a p-type floating gate transistor, which will be described later.

If the cell of the non-volatile memory device has a p-type floating gate transistor, the cell may generate a cell current I3 in the on state but generate a cell current I4 in the off state. In accordance with the present invention, a reference current source may provide a reference current Iref. The magnitude of the reference current Iref is in the range between I3 and I4. That is, I3>Iref>I4.

Figure 7A:
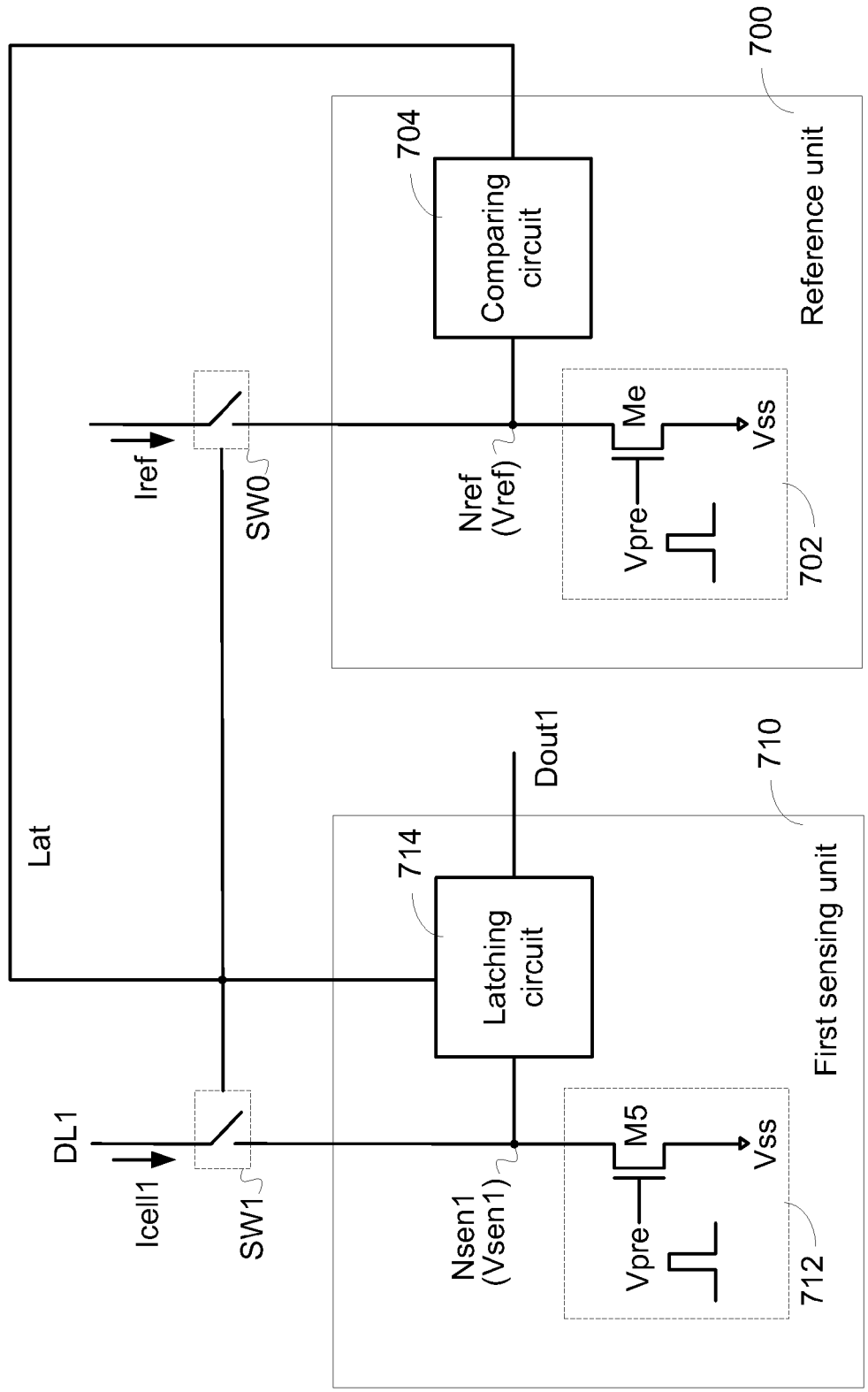
FIG. 7A is a schematic circuit diagram illustrating a current sensing amplifier according to a fourth embodiment of the present invention.
Figure 7B:
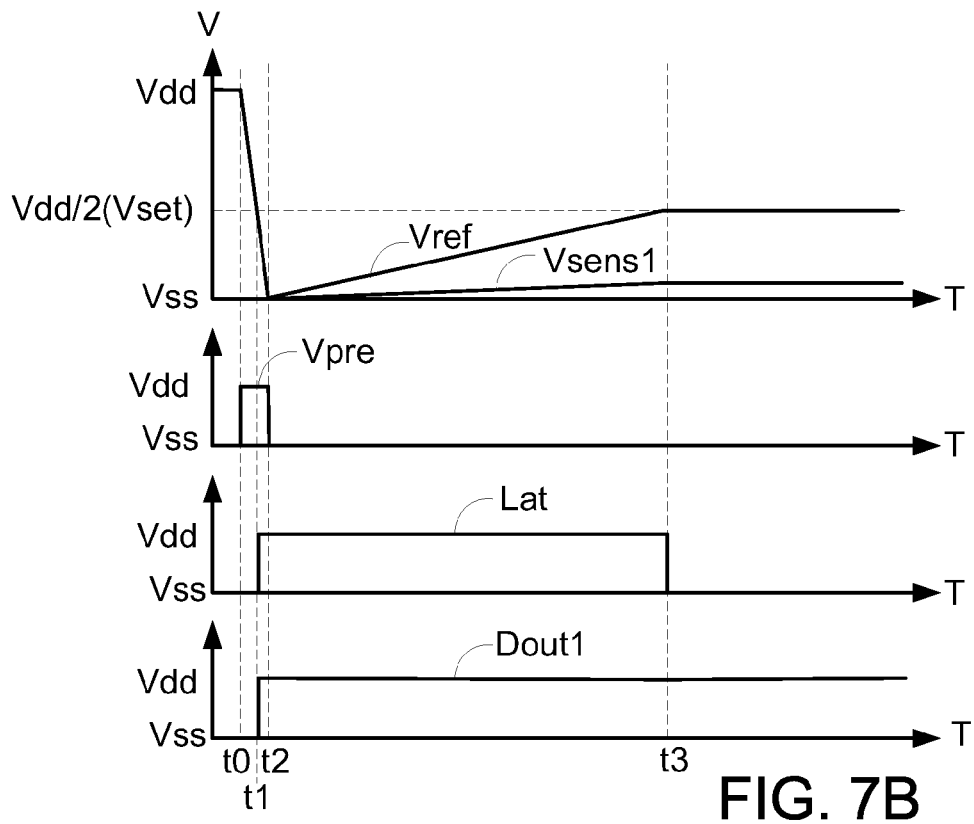
FIG. 7B is a schematic timing waveform diagram illustrating associated signals processed by the current sensing amplifier of FIG. 7A during the read cycle, in which the storing state of the cell is the off state.
Figure 7C:
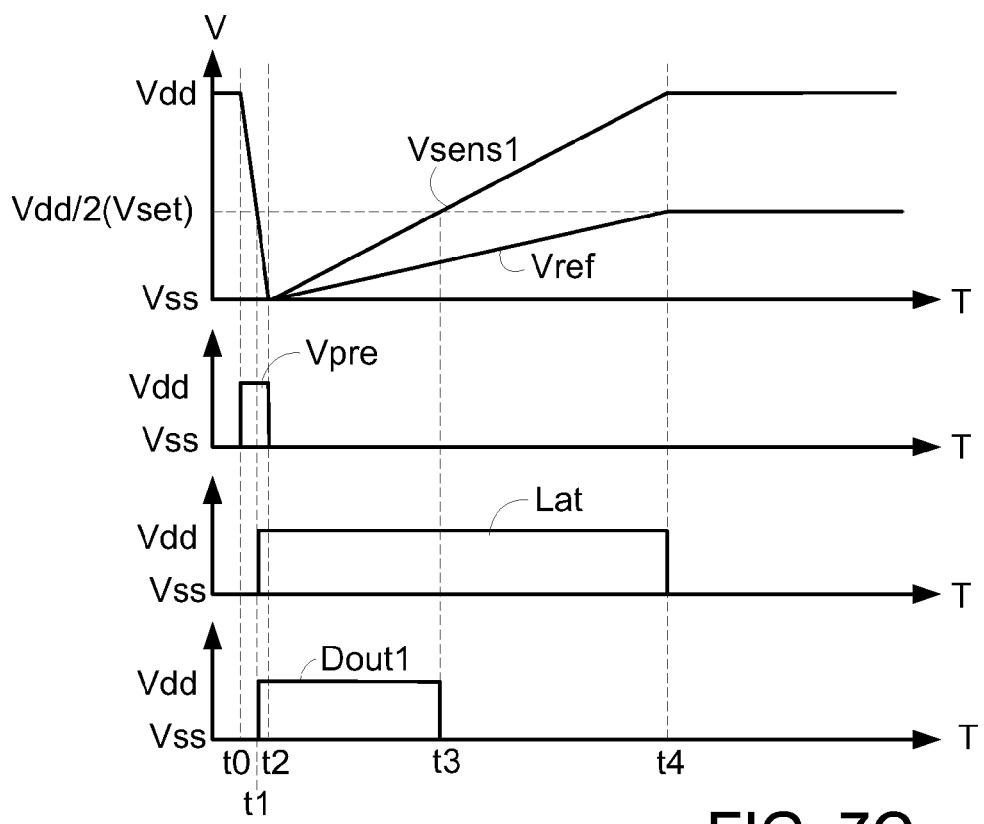
FIG. 7C is a schematic timing waveform diagram illustrating associated signals processed by the current sensing amplifier of FIG. 7A during the read cycle, in which the storing state of the cell is the on state.

FIG. 7A is a schematic circuit diagram illustrating a current sensing amplifier according to a fourth embodiment of the present invention. FIGS. 7B and 7C are schematic timing waveform diagrams illustrating associated signals processed by the current sensing amplifier according to the third embodiment of the present invention.

In FIG. 7A, only a reference unit 700 and a first sensing unit 710 are shown. It is noted that the current sensing amplifier may comprise a reference unit and plural sensing units.

In this embodiment, the current sensing amplifier comprises the reference unit 700, the first sensing unit 710, and two switch elements SW0 and SW1. The reference unit 700 comprises a constant voltage providing circuit 702 and a comparing circuit 704. The constant voltage providing circuit 702 and the comparing circuit 704 are connected with a reference node Nref. The constant voltage providing circuit 702 comprises a transistor Me. The source terminal of the transistor Me is connected with a ground voltage Vss. The gate terminal of the transistor Me receives an activating signal Vpre. The drain terminal of the transistor Me is connected with the reference node Nref. Moreover, the comparing circuit 704 may compare a reference voltage Vref of the reference node Nref with a preset voltage Vset. If the reference voltage Vref is lower than the preset voltage Vset, the latching signal Lat outputted from the comparing circuit 704 has a first voltage level (e.g. a high voltage level). Whereas, if the reference voltage Vref is higher than the preset voltage Vset, the latching signal Lat outputted from the comparing circuit 604 has a second voltage level (e.g. a low voltage level).

The switch element SW0 is controlled by the latching signal Lat. When the latching signal Lat is in the high-level state (i.e. with the first voltage level), the switch element SW0 is in a closed state. Consequently, the reference node Nref is connected with the reference current source to receive a reference current Iref. When the latching signal Lat is in the low-level state (i.e. with the second voltage level), the switch element SW0 is in an open state. Consequently, the connection between the reference node Nref and the reference current source is interrupted The first sensing unit 710 comprises a constant voltage providing circuit 712 and a latching circuit 714. The constant voltage providing circuit 712 and the latching circuit 714 are connected with a first sensing node Nsen1. The constant voltage providing circuit 712 comprises a transistor M5. The source terminal of the transistor M5 is connected with the ground voltage Vss. The gate terminal of the transistor M5 receives the activating signal Vpre. The drain terminal of the transistor M5 is connected with the first sensing node Nsen1 for receiving the first sensing voltage Vsen1. Moreover, the latching circuit 714 is controlled by the latching signal Lat. When the latching signal Lat is in the high-level state (i.e. with the first voltage level), the latching circuit 714 is disabled. When the latching signal Lat is in the low-level state (i.e. with the second voltage level), the latching circuit 714 is enabled. Moreover, when the latching circuit 714 is enabled, if the magnitude of the first sensing voltage Vsen1 is lower than the preset voltage Vset, the first output signal Dout1 outputted from the latching circuit 714 is in the high-level state (i.e. with the first voltage level), which indicates an off state of the cell. On the other hand, if the magnitude of the first sensing voltage Vsen1 is high than the preset voltage Vset, the first output signal Dout1 outputted from the latching circuit 714 is in the low-level state (i.e. with the second voltage level), which indicates an on state of the cell.

The switch element SW1 is controlled by the latching signal Lat. When the latching signal Lat is in the high-level state, the switch element SW1 is in a closed state. Consequently, the first sensing node Nsen1 is connected with a first data line DL1 to receive a first cell current Icell1. When the latching signal Lat is in the low-level state, the switch element SW1 is in an open state. Consequently, the connection between the first sensing node Nsen1 and the first data line DL1 is interrupted. Hereinafter, the operations of the current sensing amplifier will be illustrated with reference to FIGS. 6B and 6C, wherein Vset=Vdd/2.

FIG. 7B is a schematic timing waveform diagram illustrating associated signals processed by the current sensing amplifier of FIG. 7A during the read cycle, in which the storing state of the cell is the off state.

From the time point t0 to the time point t2, the transistor Me of the constant voltage providing circuit 702 of the reference unit 700 and the transistor M5 of the constant voltage providing circuit 712 of the first sensing unit 710 are shortly turned on according to the activating signal Vpre. Consequently, the reference node Nref and the first sensing node Nsen1 are discharged to the ground voltage Vss. That is, at the time point t2, both the reference voltage Vref of the reference node Nref and the first sensing voltage Vsen1 of the first sensing node Nsen1 are equal to the ground voltage Vss. Moreover, at the time point t1, the reference node Nref and the first sensing node Nsen1 are discharged to the preset voltage Vset, the latching signal Lat and the first data line DL1 are changed to a high-level state, and at the time point t2, the transistor Me and the transistor M5 are turned off according to the activating signal Vpre.

Moreover, at the time point t1, the latching signal Lat from the comparing circuit 704 is in the high-level state (i.e. with the first voltage level). Consequently, the latching circuit 714 is disabled, and the switch elements SW0 and SW1 are both in the closed state. Under this circumstance, the reference node Nref is connected with the reference current source to receive the reference current Iref, and the first sensing node Nsen1 is connected with the first data line DL1 to receive the first cell current Icell1. When the transistor Me and the transistor M5 are turned off at the time point t2, the reference voltage Vref of the reference node Nref and the first sensing voltage Vsen1 of the first sensing node Nsen1 rise up.

Since the storing state of the cell is the off state, the first cell current Icell1 is equal to the cell current I4. That is, the reference current Iref is higher than the first cell current Icell1. Consequently, after the time point t2, the reference voltage Vref of the reference node Nref rises up at a faster rate, while the first sensing voltage Vsen1 of the first sensing node Nsen1 rises up at a slower rate.

At the time point t3, the reference voltage Vref of the reference node Nref rises up to the preset voltage Vset. Correspondingly, the latching signal Lat from the comparing circuit 704 is in the low-level state (i.e. with the second voltage level). Since the latching signal Lat is in the low-level state, the switch elements SW0 and SW1 are both in the open state, and the latching circuit 714 of the first sensing unit 710 is enabled. Since the first sensing voltage Vsen1 of the first sensing node Nsen1 rises up at the slower rate, the first sensing voltage Vsen1 of the first sensing node Nsen1 is still lower than the preset voltage Vset. Correspondingly, the first output signal Dout1 from the latching circuit 714 is in the high-level state (i.e. with the first voltage level). Under this circumstance, the storing state of the cell connected with the first data line DL1 is the off state.

FIG. 7C is a schematic timing waveform diagram illustrating associated signals processed by the current sensing amplifier of FIG. 7A during the read cycle, in which the storing state of the cell is the on state.

From the time point t0 to the time point t2, the transistor Me of the constant voltage providing circuit 702 of the reference unit 700 and the transistor M5 of the constant voltage providing circuit 712 of the first sensing unit 710 are shortly turned on according to the activating signal Vpre. Consequently, the reference node Nref and the first sensing node Nsen1 are discharged to the ground voltage Vss. That is, at the time point t2, both the reference voltage Vref of the reference node Nref and the first sensing voltage Vsen1 of the first sensing node Nsen1 are equal to the ground voltage Vss. Moreover, at the time point t1, the reference node Nref and the first sensing node Nsen1 are discharged to the preset voltage Vset, the latching signal Lat and the first data line DL1 are changed to a high-level state, and at the time point t2, the transistor Me and the transistor M5 are turned off according to the activating signal Vpre.

Moreover, at the time point t1, the latching signal Lat from the comparing circuit 704 is in the high-level state (i.e. with the first voltage level). Consequently, the latching circuit 714 is disabled, and the switch elements SW0 and SW1 are both in the closed state. Under this circumstance, the reference node Nref is connected with the reference current source to receive the reference current Iref, and the first sensing node Nsen1 is connected with the first data line DL1 to receive the first cell current Icell1. When the transistor Me and the transistor M5 are turned off at the time point t2, the reference voltage Vref of the reference node Nref and the first sensing voltage Vsen1 of the first sensing node Nsen1 rise up.

Since the storing state of the cell is the on state, the first cell current Icell1 is equal to the cell current I3. That is, the reference current Iref is lower than the first cell current Icell1. Consequently, after the time point t2, the reference voltage Vref of the reference node Nref rises up at a slower rate, while the first sensing voltage Vsen1 of the first sensing node Nsen1 rises up at a faster rate.

The first sensing voltage Vsen1 of the first sensing node Nsen1 rises up to the preset voltage Vset at the time point t3, and continuously rises up. At the time point t4, the reference voltage Vref of the reference node Nref rises up to the preset voltage Vset. Correspondingly, the latching signal Lat from the comparing circuit 704 is in the low-level state (i.e. with the second voltage level). Since the latching signal Lat is in the low-level state, the switch elements SW0 and SW1 are both in the open state, and the latching circuit 714 of the first sensing unit 710 is enabled. Since the first sensing voltage Vsen1 of the first sensing node Nsen1 rises up at the faster rate, the first sensing voltage Vsen1 of the first sensing node Nsen1 is higher than the preset voltage Vset. Correspondingly, the first output signal Dout1 from the latching circuit 714 is in the low-level state (i.e. with the second voltage level). Under this circumstance, the storing state of the cell connected with the first data line DL1 is the on state.

From the above discussions, the current sensing amplifier of the present invention is capable of quickly detecting the storing state of the cell. Moreover, since no operational amplifier OP is included in the current sensing amplifier, the power consumption of the current sensing amplifier can be effectively reduced.

Moreover, during the program cycle, if less hot carriers are injected into the cell, the storing state of the cell is in the on state. That is, the cell has a lower threshold voltage (e.g. Vth_l). Whereas, if more hot carriers are injected into the cell, the storing state of the cell is in the off state. That is, the cell has a higher threshold voltage (e.g. Vth_h).

In accordance with the present invention, the reference current source may be implemented by a reference cell. That is, during the program cycle, the threshold voltage of the reference cell may be adjusted to be in the range between Vth_l and Vth-h by controlling the amount of hot carriers to be injected into the floating gate. Consequently, during the read cycle, the cell current of the reference cell is equal to the reference current Iref. The magnitude of the reference current Iref is in the range between I1 and I2, wherein I1 is the magnitude of the cell current when the cell is in the on state, and I2 is the magnitude of the cell current when the cell is in the off state.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures

What is claimed is:

1. A sensing method of a current sensing amplifier for determining a storing state of a cell of a non-volatile memory device during a read cycle, the sensing method comprising steps of:
adjusting a sensing node and a reference node to a constant voltage;
connecting the sensing node with a data line to receive a cell current from the cell, and connecting the reference node with a reference current source to receive a reference current from the reference current source; and
when a reference voltage of the reference node reaches a preset voltage, determining a storing state of the cell according to a relationship between a sensing voltage of the sensing node and the preset voltage, wherein if the sensing voltage of the sensing node is lower than the preset voltage, the cell is in a first storing state, wherein if the sensing voltage of the sensing node is higher than the preset voltage, the cell is in a second storing state;

wherein the cell current has a first current magnitude when the cell is in the first storing state, the cell current has a second current magnitude when the cell is in the second storing state, and the reference current is in a range between the first current magnitude and the second current magnitude; and wherein the cell has a first threshold voltage when the cell is in the first storing state, and the cell has a second threshold voltage when the cell is in the second storing state, the reference current source comprises a reference cell with a reference threshold voltage, and the reference threshold voltage is in a range between the first threshold voltage and the second threshold voltage.

2. The sensing method as claimed in claim 1, wherein the cell comprises an n-type storage transistor, wherein the first storing state is an on state, and the second storing state is an off state.

3. The sensing method as claimed in claim 1, wherein the cell comprises a p-type storage transistor, wherein the first storing state is an off state, and the second storing state is an on state.

4. A current sensing amplifier for determining a storing state of a first cell of a non-volatile memory device during a read cycle, the current sensing amplifier comprising:

a reference unit comprising a constant voltage providing circuit and a comparing circuit, wherein the constant voltage providing circuit and the comparing circuit are connected with a reference node, wherein after the reference node is adjusted to a constant voltage by the constant voltage providing circuit according to an activating signal, the reference node is connected with a reference current source to receive a reference current from the reference current source; and a first sensing unit comprising a constant voltage providing circuit and a latching circuit, wherein the constant voltage providing circuit and the latching circuit are connected with a first sensing node, wherein after the first sensing node is adjusted to the constant voltage by the constant voltage providing circuit according to the activating signal, the first sensing node is connected with a first data line to receive a first cell current from the first cell, wherein when the comparing circuit detects that a reference voltage of the reference node reaches a preset voltage, the comparing circuit issues a latching signal to the latching circuit, so that the latching circuit determines whether the first cell is in a first storing state or a second storing state according to a relationship between a first sensing voltage of the first sensing node and the preset voltage.

5. The current sensing amplifier as claimed in claim 4, further comprising a second sensing unit, wherein the second sensing unit comprises a constant voltage providing circuit and a latching circuit, wherein the constant voltage providing circuit and the latching circuit are connected with a second sensing node, wherein after the second sensing node is adjusted to the constant voltage by the constant voltage providing circuit according to the activating signal, the second sensing node is connected with a second data line to receive a second cell current from the second cell, wherein when the latching signal is received by the latching circuit, so that the latching circuit determines whether the second cell is in the first storing state or the second storing state according to a relationship between a second sensing voltage of the second sensing node and the preset voltage.

6. The current sensing amplifier as claimed in claim 4, wherein if the first sensing voltage of the first sensing node is lower than the preset voltage, the latching circuit of the first sensing unit generates a first voltage level to indicate that the first cell is in the first storing state, wherein if the first sensing voltage of the first sensing node is higher than the preset voltage, the latching circuit of the first sensing unit generates a second voltage level to indicate that the first cell is in the second storing state.

7. The current sensing amplifier as claimed in claim 6, wherein the first cell comprises an n-type storage transistor, wherein the first storing state is an on state, and the second storing state is an off state.

8. The current sensing amplifier as claimed in claim 6, wherein the first cell comprises a p-type storage transistor, wherein the first storing state is an off state, and the second storing state is an on state.

9. The current sensing amplifier as claimed in claim 4, wherein the first cell current has a first current magnitude when the first cell is in the first storing state, and the first cell current has a second current magnitude when the first cell is in the second storing state, wherein the reference current is in a range between the first current magnitude and the second current magnitude.

10. The current sensing amplifier as claimed in claim 4, wherein the first cell has a first threshold voltage when the first cell is in the first storing state, and the first cell has a second threshold voltage when the first cell is in the second storing state, wherein the reference current source comprises a reference cell with a reference threshold voltage, wherein the reference threshold voltage is in a range between the first threshold voltage and the second threshold voltage.

11. The current sensing amplifier as claimed in claim 4, wherein the constant voltage providing circuit of the reference unit comprises a first p-type transistor, wherein the first p-type transistor comprises a source terminal receiving a power supply voltage, a gate terminal receiving the activating signal and a drain terminal connected with the reference node, wherein the constant voltage is the power supply voltage.

12. The current sensing amplifier as claimed in claim 11, wherein the constant voltage providing circuit of the first sensing unit comprises a second p-type transistor, wherein the second p-type transistor comprises a source terminal receiving the power supply voltage, a gate terminal receiving the activating signal and a drain terminal connected with the first sensing node.

13. The current sensing amplifier as claimed in claim 12, wherein the comparing circuit of the reference unit comprises:

a first inverter having a first inverter input terminal connected to the reference node, and having a first inverter output terminal;

a second inverter controlled by the latching signal, wherein the second inverter has a second inverter input terminal connected with the first inverter output terminal, and has a second inverter output terminal connected with the first inverter input terminal; and a third inverter having a third inverter input terminal connected with the first inverter output terminal, and having a third inverter output terminal generating the latching signal, wherein a transition voltage of the first inverter is the preset voltage.

14. The current sensing amplifier as claimed in claim 13, wherein the latching circuit of the first sensing unit comprises:

a fourth inverter having a fourth inverter input terminal connected to the first sensing node, and having a fourth inverter output terminal;

a fifth inverter controlled by the latching signal, wherein the fifth inverter has a fifth inverter input terminal connected with the fourth inverter output terminal, and has a fifth inverter output terminal connected with the fourth inverter input terminal; and a sixth inverter having a sixth inverter input terminal connected with the fourth inverter output terminal, and having a sixth inverter output terminal generating a first output signal to indicate that the first cell is in the first storing state or the second storing state, wherein a transition voltage of the fourth inverter is the preset voltage.

15. The current sensing amplifier as claimed in claim 12, wherein the comparing circuit of the reference unit comprises:

a first preset voltage generator for generating the preset voltage;

a first comparator having a first comparator first input terminal connected to the reference node, having a first comparator second input terminal receiving the preset voltage, and having a first comparator output terminal;

a first switch element controlled by the latching signal, wherein the first switch element has a first switch element first terminal connected to the first comparator output terminal, and has a first switch element second terminal;

a first inverter having a first inverter input terminal connected to the first switch element second terminal, and having a first inverter output terminal;

a second inverter controlled by the latching signal, wherein the second inverter has a second inverter input terminal connected with the first inverter output terminal, and has a second inverter output terminal connected with the first inverter input terminal; and a third inverter having a third inverter input terminal connected with the first inverter output terminal, and having a third inverter output terminal;

a fourth inverter having a fourth inverter input terminal connected with the third inverter output terminal, and having a fourth inverter output terminal;

a NAND gate having a NAND gate first input terminal connected with the fourth inverter output terminal, having a NAND gate second input terminal receiving the activating signal, and having a NAND gate output terminal generating the latching signal.

16. The current sensing amplifier as claimed in claim 15, wherein the latching circuit of the first sensing unit comprises:

a second preset voltage generator for generating the preset voltage;

a second comparator having a second comparator first input terminal connected to the first sensing node, having second comparator second input terminal receiving the preset voltage, and having a second comparator output terminal;

a second switch element controlled by the latching signal, wherein the second switch element has a second switch element first terminal connected to the second comparator output terminal, and has a second switch element second terminal;

a fifth inverter having a fifth inverter input terminal connected to the second switch element second terminal, and having a fifth inverter output terminal;

a sixth inverter controlled by the latching signal, wherein the sixth inverter has a sixth inverter input terminal connected with the fifth inverter output terminal, and has a sixth inverter output terminal connected with the fifth inverter input terminal; and a seventh inverter having a seventh inverter input terminal connected with the fifth inverter output terminal, and having a seventh inverter output terminal generating a first output signal to indicate that the first cell is in the first storing state or the second storing state.

17. The current sensing amplifier as claimed in claim 12, wherein the comparing circuit of the reference unit comprises:

a first preset voltage generator for generating the preset voltage;

a first comparator having a first comparator first input terminal connected to the reference node, having a first comparator second input terminal receiving the preset voltage, and having a first comparator output terminal;

a first inverter having a first inverter input terminal connected to the first comparator output terminal, and having a first inverter output terminal; and a second inverter having a second inverter input terminal connected with the first inverter output terminal, and having a second inverter output terminal generating the latching signal.

18. The current sensing amplifier as claimed in claim 17, wherein the latching circuit of the first sensing unit comprises:

a second preset voltage generator for generating the preset voltage;

a second comparator having a second comparator first input terminal connected to the first sensing node, having a second comparator second input terminal receiving the preset voltage, and having a second comparator output terminal;

a first switch element controlled by the latching signal, wherein the first switch element has a first switch element first terminal connected to the second comparator output terminal, and has a first switch element second terminal;

a third inverter having a third inverter input terminal connected to the first switch element second terminal, and having a third inverter output terminal;

a fourth inverter controlled by the latching signal, wherein the fourth inverter has a fourth inverter input terminal connected with the third inverter output terminal, and has a fourth inverter output terminal connected with the third inverter input terminal; and a fifth inverter having a fifth inverter input terminal connected with the third inverter output terminal, and having a fifth inverter output terminal generating a first output signal to indicate that the first cell is in the first storing state or the second storing state.

19. The current sensing amplifier as claimed in claim 4, wherein the constant voltage providing circuit of reference unit comprises a first n-type transistor, wherein the first n-type transistor comprises a source terminal receiving a ground voltage, a gate terminal receiving the activating signal and a drain terminal connected with the reference node, wherein the constant voltage is the ground voltage.

20. The current sensing amplifier as claimed in claim 19, wherein the constant voltage providing circuit of the first sensing unit comprises a second n-type transistor, wherein the second n-type transistor comprises a source terminal receiving the ground voltage, a gate terminal receiving the activating signal and a drain terminal connected with the first sensing node.

21. The current sensing amplifier as claimed in claim 20, wherein the comparing circuit of the reference unit compares the reference voltage with the preset voltage, wherein if the reference voltage is lower than the preset voltage, the latching signal outputted from the comparing circuit has a first voltage level, wherein if the reference voltage is higher than the preset voltage, the latching signal outputted from the comparing circuit has a second voltage level.

22. The current sensing amplifier as claimed in claim 21, wherein the latching circuit of the first sensing unit is controlled by the latching signal, wherein the latching circuit is disabled when the latching signal has the first voltage level, and the latching circuit is enabled when the latching signal has the second voltage level, wherein when the latching circuit is enabled, if the first sensing voltage is lower than the preset voltage, a first output signal outputted from the latching circuit has the first voltage level, indicating that the first cell is in the first storing state, wherein when the latching circuit is enabled, if the first sensing voltage is higher than the preset voltage, the first output signal outputted from the latching circuit has the second voltage level, indicating that the first cell is in the second storing state.

23. The current sensing amplifier as claimed in claim 4, wherein circuit structures of the reference unit and the first sensing unit are identical.

* * * * *